US012765421B2

(12) United States Patent
Momoi

(10) Patent No.: US 12,765,421 B2
(45) Date of Patent: Oct. 13, 2026

(54) SURFACE LIGHT SOURCE DEVICE

(71) Applicant: Enplas Corporation, Saitama (JP)

(72) Inventor: Takuro Momoi, Saitama (JP)

(73) Assignee: Enplas Corporation, Saitama (JP)

( * ) Notice: Subject to any disclaimer, the term of this patent is extended or adjusted under 35 U.S.C. 154(b) by 560 days.

(21) Appl. No.: 18/224,102

(22) Filed: Jul. 20, 2023

(65) Prior Publication Data

US 2024/0030207 A1 Jan. 25, 2024

(30) Foreign Application Priority Data

Jul. 22, 2022 (JP) ................................. 2022-117366
Apr. 28, 2023 (JP) ................................. 2023-074597

(51) Int. Cl.

| | |
|---|---|
| ***H10H 20/814*** | (2025.01) |
| ***H10H 20/80*** | (2025.01) |
| ***H10H 20/813*** | (2025.01) |
| ***H10H 20/855*** | (2025.01) |
| ***H10W 90/00*** | (2026.01) |

(52) U.S. Cl.
CPC .......... *H10W 90/00* (2026.01); *H10H 20/813* (2025.01); *H10H 20/814* (2025.01); *H10H 20/855* (2025.01); *H10H 20/882* (2025.01)

(58) Field of Classification Search
CPC ............. H10H 20/1863; H10H 20/184; H10H 20/855; H10H 20/882
See application file for complete search history.

(56) References Cited

U.S. PATENT DOCUMENTS

2019/0280163 A1 9/2019 Li et al.

FOREIGN PATENT DOCUMENTS

JP 2019-149547 9/2019
TW I567454 B * 1/2017

* cited by examiner

*Primary Examiner* — Joseph L Williams

(57) ABSTRACT

A surface light source device includes a plurality of light source blocks, each of which includes a light-emitting element array composed of a plurality of light-emitting elements arranged in the first direction. Each of the plurality of light-emitting elements includes a plurality of light emission chips arranged in the first direction, with different colors of emission light. In the light-emitting element array, the colors of the light emitted from the light emission chips at both end portions are the same.

17 Claims, 26 Drawing Sheets

SURFACE LIGHT SOURCE DEVICE

This application is entitled to the benefit of Japanese Patent Application No. 2023-074597, filed on Apr. 28, 2023 and Japanese Patent Application No. 2022-117366, filed on Jul. 22, 2022, the disclosure of which including the specification, drawings and abstract is incorporated herein by reference in its entirety.

TECHNICAL FIELD

The present invention relates to a surface light source device.

BACKGROUND ART

A direct surface light source device is used as a backlight in some situation in transmissive image display devices such as liquid crystal display apparatuses and signs. In recent years, direct surface light source devices that include a plurality of light-emitting elements as a light source are used (see, for example, PTL 1).

The LED package module (surface light source device) disclosed in PTL 1 includes a substrate, and a plurality of light-emitting element units disposed on the substrate. Each of the plurality of light-emitting element units includes a red emission chip, a blue emission chip, and a green light emission chip arranged in a line. In the plurality of light emission units, the red emission chip, the blue emission chip, and the green light emission chip are disposed in the same order in the same direction.

CITATION LIST

Patent Literature

PTL 1

Japanese Patent Application Laid-Open No. 2019-149547

SUMMARY OF INVENTION

Technical Problem

However, in the surface light source device disclosed in PTL 1, it is difficult to sufficiently mix light emitted from each light emission chip, and color unevenness easily occurs.

In view of this, an object of the present invention is to provide a surface light source device including a plurality of light emission chips with different colors of emission light, and capable of suppressing color unevenness.

Solution to Problem

[1] A surface light source device including a plurality of light source blocks arranged in a first direction and a second direction orthogonal to the first direction. Each of the plurality of light source blocks includes one or more lines of a light-emitting element array including a plurality of light-emitting elements arranged in the first direction. Each of the plurality of light-emitting elements includes a plurality of light emission chips arranged in the first direction, the plurality of light emission chips being different from each other in color of emission light. In the one or more lines of the light-emitting element array in the light source block, colors of light emitted from all of the light emission chips at both end portions are the same.

[2] The surface light source device according to [1], in which the plurality of light-emitting elements includes a red emission chip configured to emit red light, a green light emission chip configured to emit green light, and a blue emission chip configured to emit blue light.

[3] The surface light source device according to [1] or [2], in which in each of the plurality of light source blocks, a plurality of lines of the light-emitting element array is disposed in the second direction.

[4] The surface light source device according to any one of [1] to [3], in which in the plurality of light-emitting elements, a first light-emitting element and a second light-emitting element adjacent to each other are disposed such that a color of light emitted from a light emission chip at a position closest to the second light-emitting element in the first light-emitting element and a color of light emitted from a light emission chip at a position closest to the first light-emitting element in the second light-emitting element are the same.

[5] The surface light source device according to [3], in which the plurality of light-emitting elements is disposed in a rectangular grid.

[6] The surface light source device according to any one of [1] to [4], further including a plurality of light flux controlling members configured to control light emitted from the plurality of light-emitting elements.

[7] The surface light source device according to [5] or [6], in which each of the plurality of light flux controlling members includes a scattering member.

[8] The surface light source device according to [6], in which each of the plurality of light source blocks includes one line of the light-emitting element array, in which each of the plurality of light source blocks further includes one light flux controlling member configured to control light emitted from the one line of the light-emitting element array, and in which the light flux controlling member is configured such that light advances farther in the second direction than in the first direction.

[9] The surface light source device according to [8], in which the light flux controlling member includes: an incidence surface that is an inner surface of a recess opening at a bottom surface, the incidence surface being disposed to intersect optical axes of an even number of the light-emitting elements; a total reflection surface configured to reflect at least in the second direction light entered from the incidence surface; and an emission surface configured to emit to outside light reflected by the total reflection surface, and in which the total reflection surface includes: two first total reflection surfaces extending along the first direction and each including two end portions in the first direction; and two second total reflection surfaces each configured to connect both ends of the two first total reflection surfaces in the first direction.

[10] The surface light source device according to [9], in which each of the two second total reflection surfaces is disposed such that the greater a distance from the optical axis in the first direction, the farther each of the two second total reflection surfaces is from the light-emitting element in a direction along the optical axis, each of the two second total reflection surfaces including an inner end portion disposed on an optical axis side and an outer end portion disposed at a position farther from the optical axis than the inner end portion in the first direction, in which the incidence surface includes: a first incidence surface disposed opposite to a light-emitting surface of the light-emitting element; and a second incidence surface configured to connect the first incidence surface and the bottom surface, and in which in the first direction, an end portion of the first incidence surface is disposed on inside than the inner end portion of the second total reflection surface.

[11] The surface light source device according to [10], in which in the first direction, the optical axis of the light-emitting element at both ends included in the light-emitting element array in the light source block coincides with the end portion of the first incidence surface.

[12] The surface light source device according to any one of [1] to [11], in which a center-to-center distance of the plurality of light-emitting elements is within a range of 2 to 80 mm.

[13] The surface light source device according to any one of [1] to [12], in which an order of the plurality of light emission chips is the same in a first light source block and a second light source block adjacent to each other in the first direction among the plurality of light source blocks.

[14] The surface light source device according to any one of [1] to [13], in which an order of the plurality of light emission chips is the same in a third light source block and a fourth light source block adjacent to each other in the second direction among the plurality of light source blocks.

[15] The surface light source device according to any one of [1] to [14], further including a diffusion plate configured to diffuse light emitted from the plurality of light-emitting elements while transmitting the light emitted from the plurality of light-emitting elements.

[16] The surface light source device according to [11], further including a substrate on which the plurality of light-emitting elements is disposed, in which a distance between the substrate and the diffusion plate is within a range of 1 to 30 mm.

[17] The surface light source device according to [16], in which a ratio of the distance between the substrate and the diffusion plate with respect to a center-to-center distance of the plurality of light-emitting elements is 0.15 or greater.

Advantageous Effects of Invention

According to the present invention, a surface light source device that can suppress color unevenness can be provided.

DESCRIPTION OF EMBODIMENTS

Embodiments of the present invention are elaborated below with reference to the accompanying drawings.

Embodiment 1

Configuration of Surface Light Source Device

Figure 1A:
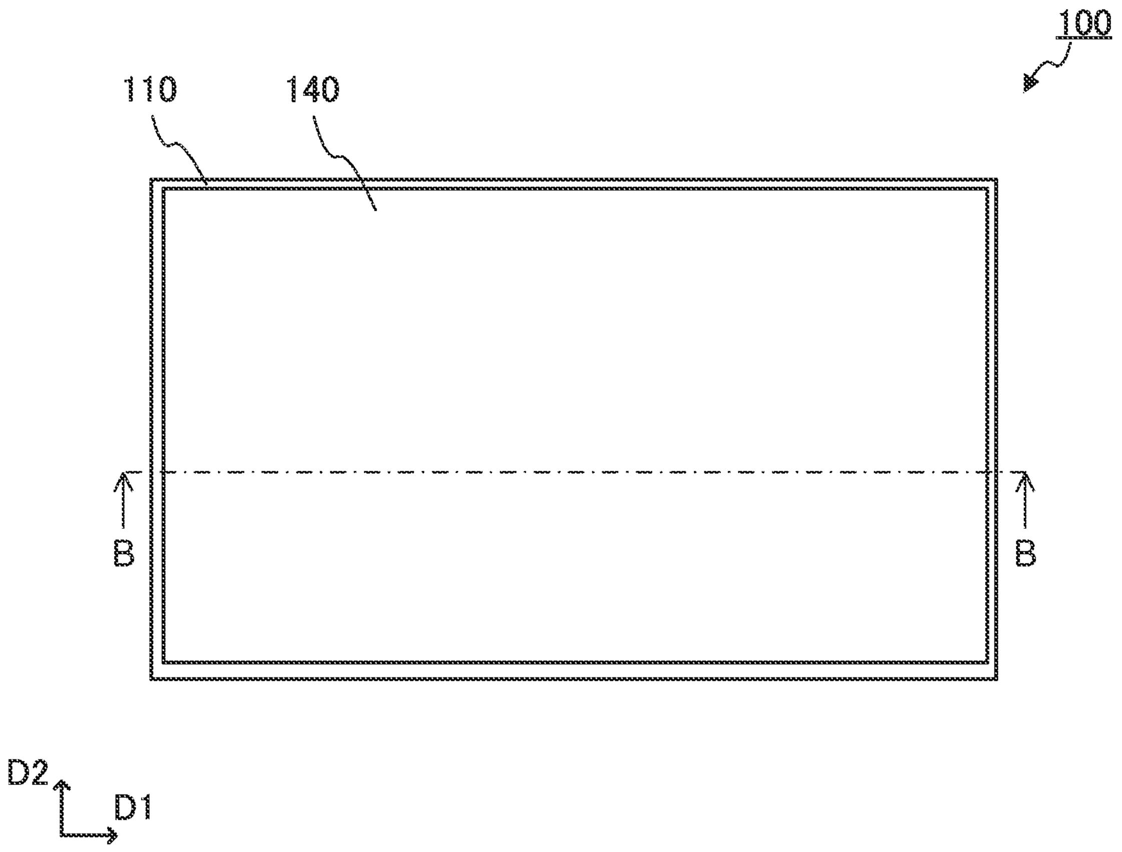
FIGS. 1A and 1B are diagrams illustrating a configuration of a surface light source device according to Embodiment 1.
Figure 1B:
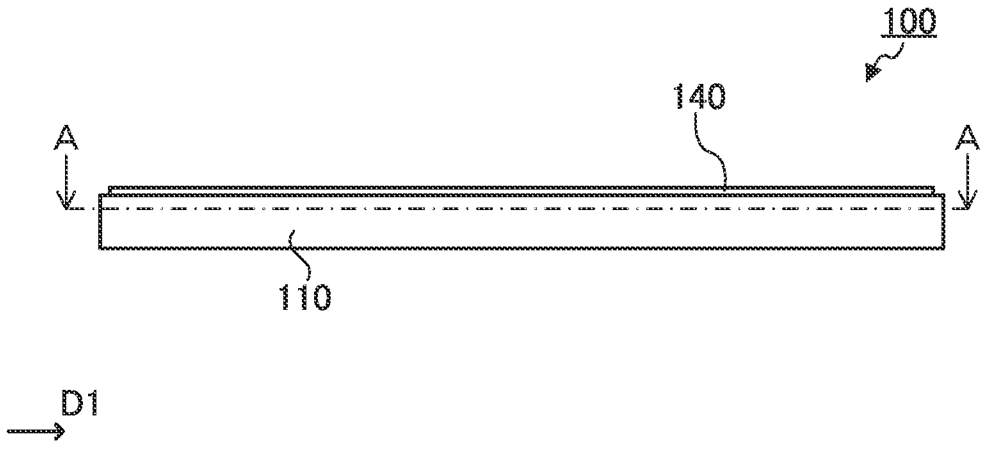
Figure 2:
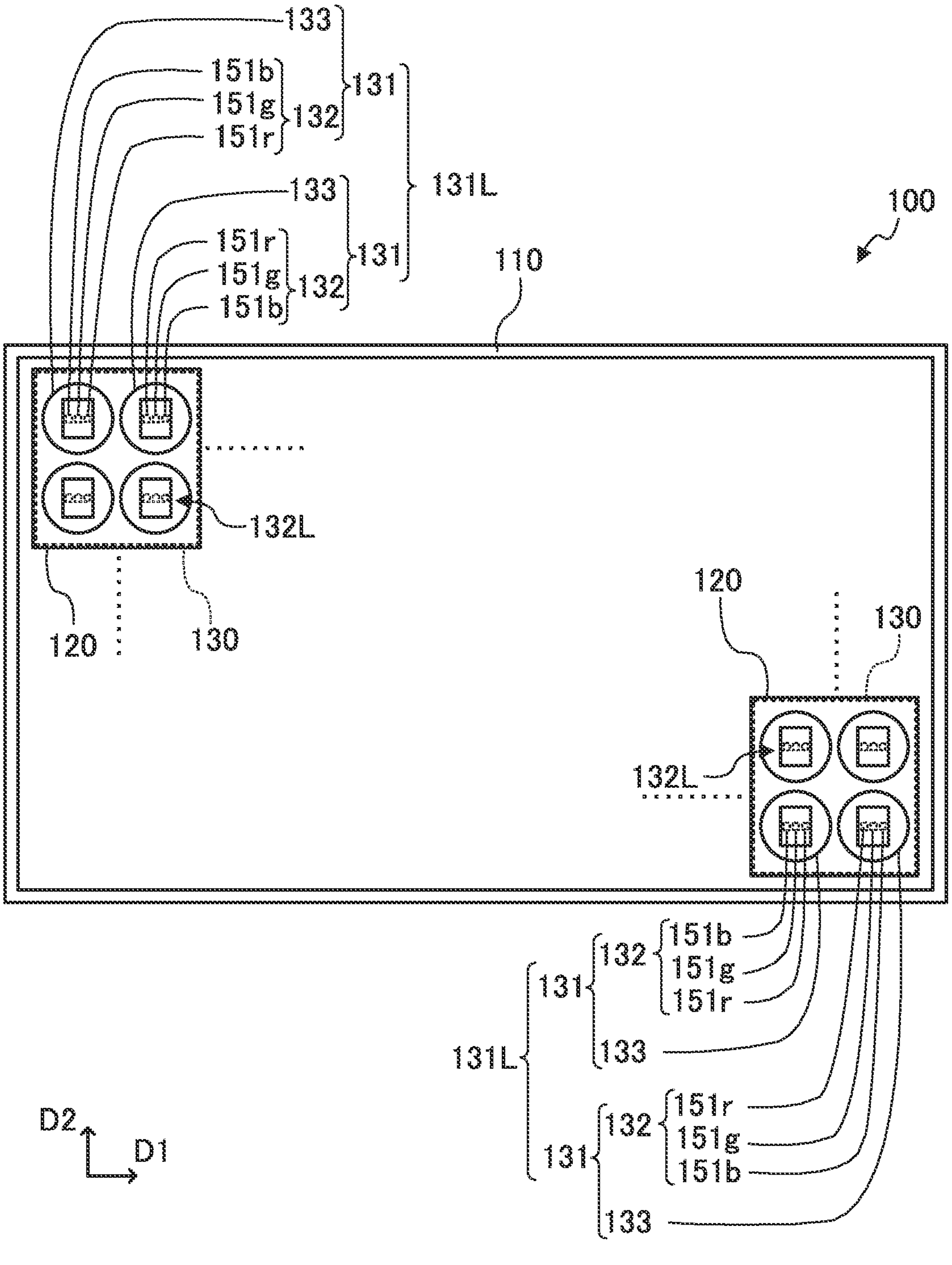
FIG. 2 is a sectional view taken along line A-A of in FIG. 1B.
Figure 3:
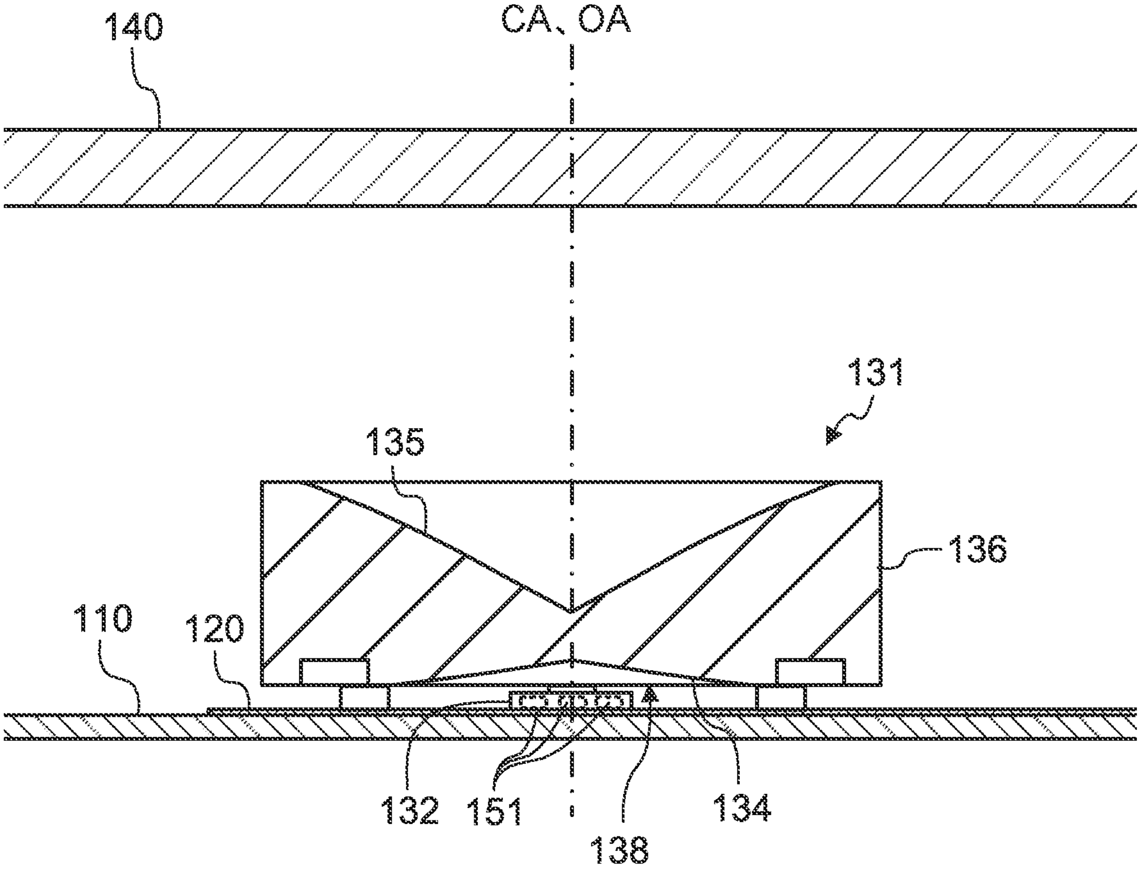
FIG. 3 is a partially enlarged sectional view of a sectional view taken along line B-B of FIG. 1A.
Figure 4A:
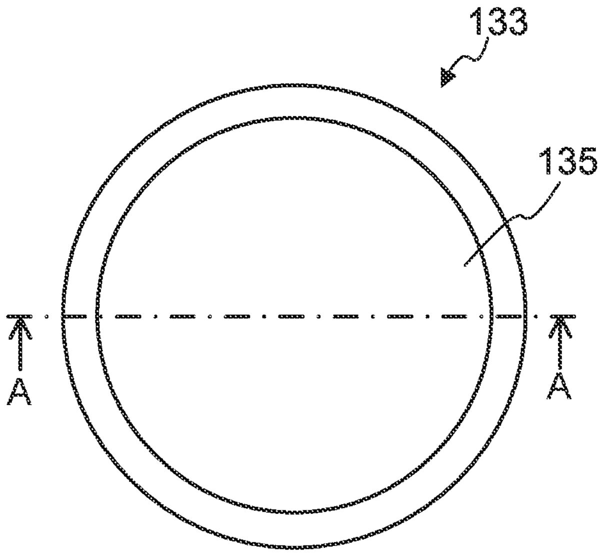
FIGS. 4A to 4D are diagrams illustrating a configuration of a light flux controlling member.
Figure 4B:
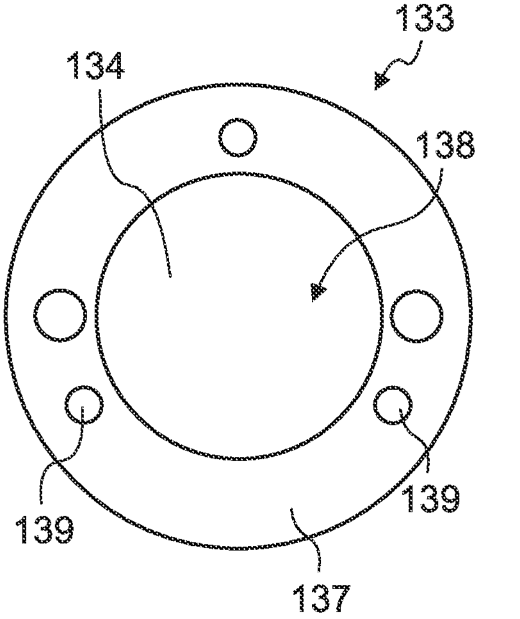
Figure 4C:
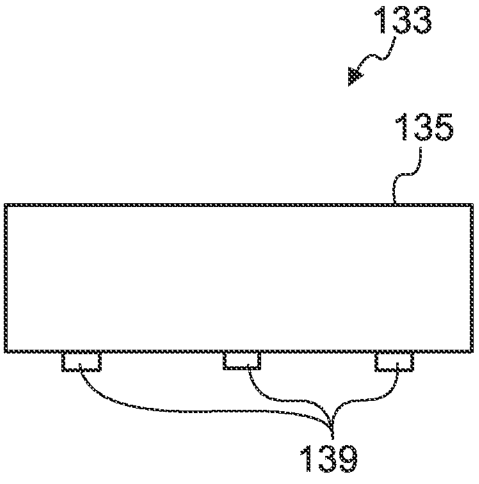
Figure 4D:
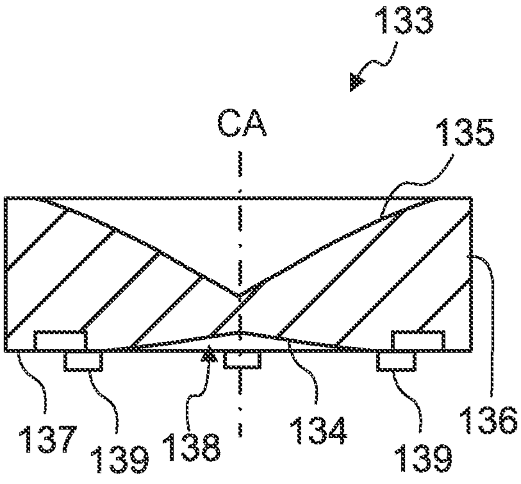

FIGS. 1A, 1B and 2 are diagrams illustrating a configuration of surface light source device 100. FIG. 1A is a plan view of surface light source device 100, and FIG. 1B is a front view. FIG. 2 is a sectional view taken along line A-A of FIG. 1B. FIG. 3 is a partially enlarged sectional view of a sectional view taken along line B-B of FIG. 1A. FIGS. 4A to 4D are diagrams illustrating a configuration of light flux controlling member 133. FIG. 4A is a plan view of light flux controlling member 133, FIG. 4B is a bottom view, FIG. 4C is a front view, and FIG. 4D is a sectional view taken along line A-A of FIG. 4A.

Surface light source device 100 includes a plurality of light source blocks 130. Note that in the present embodiment, as illustrated in FIGS. 1A, 1B and 2, surface light source device 100 includes housing 110, a plurality of substrates 120, the plurality of light source blocks 130, and diffusion plate 140.

Housing 110 is a box for housing inside the plurality of substrates 120 and the plurality of light source blocks 130 each including a plurality of light-emitting devices 131, with a cuboid shape with at least one surface partially opening. Housing 110 is composed of a top plate, a bottom plate opposite to the top plate, and four side plates connecting the top plate and the bottom plate. An opening with a rectangular shape that serves as a light emission region is formed in the top plate. This opening is closed with diffusion plate 140. The size of the opening corresponds to the size of the light emission region (light-emitting surface) formed in diffusion plate 140, and is, for example, 400 mm×700 mm (32 inch), or 934 mm×1660 mm (75 inch). Housing 110 is composed of a resin such as polymethylmethacrylate (PMMA) and polycarbonate (PC), a metal such as stainless steel and aluminum, and/or the like, for example.

The plurality of substrates 120 is flat plates for disposing the plurality of light source blocks 130 (light-emitting devices 131) at a predetermined interval inside housing 110. Substrate 120 is disposed on the bottom plate of housing 110. The surface of substrate 120 may be configured to reflect reaching light toward diffusion plate 140, or may be configured to not reflect reaching light toward diffusion plate 140. In the present embodiment, the surface of substrate 120 is configured to reflect reaching light toward diffusion plate 140. Substrate 120 is disposed in parallel to diffusion plate 140. The height from the surface of substrate 120 to diffusion plate 140 (space thickness) is not limited, but is preferably within a range of 1 to 30 mm.

The plurality of light source blocks 130, disposed on substrate 120, is the units of turning light on and off in a local dimming control. The plurality of light source blocks 130 is disposed in first direction D1 and second direction D2 orthogonal to first direction D1 (see FIG. 2). The number of light source blocks 130 disposed on substrate 120 is not limited. The number of light source blocks 130 disposed on substrate 120 is appropriately set based on the size of the light emission region (light-emitting surface) defined by the opening of housing 110. For example, in the case where the size of the light emission region (light-emitting surface) is 75 inch, 200 to 4000 light source blocks 130 are disposed. Each of the plurality of light source blocks 130 includes the plurality of light-emitting devices 131. Each of the plurality of light source blocks 130 includes one or more lines of light-emitting device array 131L composed of the plurality of light-emitting devices 131 arranged in first direction D1. In addition, each of the plurality of light source blocks 130 includes one or more lines of light-emitting element array 132L composed of a plurality of light-emitting elements 132 arranged in first direction D1.

Each of the plurality of light-emitting devices 131 includes light-emitting element 132. Note that light-emitting device 131 in the present embodiment includes light-emitting element 132 and light flux controlling member 133. That is, each of the plurality of light-emitting devices 131 may not include light flux controlling member 133. Each of the plurality of light-emitting devices 131 may include one light flux controlling member 133 for one light-emitting element 132, or include one light flux controlling member 133 for the plurality of light-emitting elements 132. In the present embodiment, one light flux controlling member 133 is provided for one light-emitting element 132. In addition, in the present embodiment, each of the plurality of light-emitting devices 131 is disposed such that optical axis OA of light emitted from light-emitting element 132 is along the normal to the surface of substrate 120. The plurality of light-emitting devices 131 is arranged in first direction D1 so as to be light-emitting device array 131L. Further, a plurality of light-emitting device arrays 131L may be disposed in second direction D2 orthogonal to first direction D1. In the present embodiment, a plurality of light-emitting device arrays 131L composed of the plurality of light-emitting devices 131 arranged in first direction D1 is disposed in second direction D2. Preferably, the number of light-emitting devices 131 in light source block 130 is within a range of 2 to 12. Preferably, the number of light-emitting devices 131 included in light-emitting device array 131L is 2n (n is a positive integer). The arrangement of light-emitting devices 131, in second direction D2×first direction D1, is 1×2, 1×4, 1×6, 1×8, 1×10, 1×12, 2×2, 2×4, 2×6, 3×2, 3×4, 4×2, 5×2, or 6×2.

Light-emitting element 132 is the light source of surface light source device 100 (and light-emitting device 131). Light-emitting element 132 is disposed on substrate 120. The plurality of light-emitting elements 132 is arranged in first direction D1, and makes up light-emitting device array 131L. A plurality of light-emitting element arrays 132L may be arranged in the second direction D2. That is, light-emitting elements 132 may be arranged in first direction D1 and second direction D2. In other words, the plurality of light-emitting elements 132 may be disposed in a rectangular grid. Here, the rectangular grid means that each light-emitting element 132 is disposed at each intersection of the grid. In addition, the rectangular may be oblong or square. The center-to-center distance of two light-emitting elements 132 adjacent to each other in first direction D1 and second direction D2 is not limited. Preferably, the center-to-center distance is within a range of 2 to 80 mm. The number of light-emitting elements 132 included in light-emitting device array 131L is not limited as long as a plurality of light-emitting elements 132 is provided. Preferably, the number of light-emitting elements 132 in the present embodiment is the same as that of light-emitting devices 131, i.e., the number of light-emitting elements 132 included in light-emitting device array 131L is 2n (n is a positive integer). The arrangement of light-emitting element 132, in second direction D2×first direction D1, is 1×2, 1×4, 1×6, 1×8, 1×10, 1×12, 2×2, 2×4, 2×6, 3×2, 3×4, 4×2, 5×2, or 6×2.

Each of the plurality of light-emitting elements 132 includes a plurality of light emission chips 151 with different emission light colors. The color of light emitted from light emission chip 151 is not limited. In the present embodiment, one light emission chip 151 includes red emission chip 151*r* that emits red (R) light, green light emission chip 151*g* that emits green (G) light, and blue emission chip 151*b* that emits (B) blue light. In each light-emitting element 132, the colors of light emitted from light emission chips 151 at both end portions are the same in light-emitting device array 131L and light-emitting element array 132L in which the three light emission chips, 151*r*, 151*g* and 151*b*, are arranged in first direction D1.

Note that one of the features of the present invention is the arrangement of the three light emission chips 151*r*, 151*g* and 151*b* in surface light source device 100, and therefore the details thereof are described later.

Light flux controlling member 133 controls the distribution of light emitted from light-emitting element 132. Light flux controlling member 133 may be a so-called total reflection lens, a diffusion lens, or a so-called condenser lens. In the present embodiment, light flux controlling member 133 is a total reflection lens. In the present embodiment, as illustrated in FIGS. 4A to 4D, light flux controlling member 133 includes incidence surface 134, total reflection surface 135, and emission surface 136. Note that light flux controlling member 133 may include leg part 139 for fixing substrate 120. Light flux controlling member 133 controls at least light emitted from light-emitting element 132 such that the light advances in first direction D1, the direction perpendicular to first direction D1 (central axis CA or optical axis OA), and toward substrate 120 side. Preferably, light flux controlling member 133 contains a scattering member from the viewpoint of providing light diffusibility. Examples of the scattering member include beads.

Light flux controlling member 133 is integrally molded. Preferably, the material of light flux controlling member 133 is optically transparent resin compositions or glass compositions. The resin composition includes an optically transparent resin and a scattering member. In addition, the glass composition includes glass and a scattering member. Examples of the optically transparent resin include polymethylmethacrylate (PMMA), polycarbonate (PC), and epoxy resin (EP). Examples of the scattering member include silicone particles, silica particles, melamine-formaldehyde condensates, and titanium oxide particles. Preferably, the scattering member is silicone particles from the viewpoint of heat stability and uniform dispersion for the optically transparent resins. The average particle diameter of the scattering member number is not limited, but is preferably within a range of 4 to 10 μm. The density of the scattering member in the resin composition or the glass composition is not limited as long as the above-mentioned function can be ensured, but is preferably within a range of 0.01 to 0.3 wt. %, more preferably within a range of 0.1 to with respect to the resin composition or the glass composition.

Incidence surface 134 allows incidence of a part of light emitted from light-emitting element 132. Incidence surface 134 is the inner surface of recess 138 formed in a center portion of bottom surface 137 (the surface on light-emitting element 132 side) of light flux controlling member 133. The shape of incidence surface 134 is not limited. The shape of incidence surface 134 may be an edgeless curved surface such as a hemispherical shape and a semi-ellipsoid shape, or an edged surface with a top surface and a side surface. In the present embodiment, the shape of incidence surface 134 is formed such that the absolute value of the gradient of the tangent gradually decreases in the direction from central axis CA side toward the end portion of incidence surface 134 in first direction D1 in the cross section including central axis CA. Here, central axis CA means the middle point of the major axis and the middle point of the minor axis in plan view of light flux controlling member 133.

Total reflection surface 135 is disposed on the side (diffusion plate 140 side) opposite to light-emitting element 132 with incidence surface 134 therebetween. In addition, total reflection surface 135 reflects a part of light entered from incidence surface 134 in a direction (lateral direction) perpendicular to the optical axis (central axis CA). Total reflection surface 135 is formed such that in a cross-section taken along a plane including central axis CA, the height from bottom surface 137 (substrate 120) increases in the direction from central axis CA toward the both end portions of total reflection surface 135 with central axis CA as a boundary. More specifically, total reflection surface 135 is formed such that in a cross-section taken along that plane, the gradient of the tangent gradually decreases in the direction from central axis CA toward the end portions of total reflection surface 135.

Emission surface 136 emits to the outside the light reflected by total reflection surface 135. Emission surface 136 connects bottom surface 137 and total reflection surface 135. Emission surface 136 is disposed to surround central axis CA. In the present embodiment, emission surface 136 is disposed in parallel to central axis CA in a cross-section taken along a plane including central axis CA. Specifically, in the present embodiment, emission surface 136 has a shape of the side surface of a column.

Diffusion plate 140 is disposed to close the opening of housing 110. Diffusion plate 140 is a plate-shaped member with a light diffusibility, and diffuses light emitted from light-emitting device 131 while transmitting the light. Normally, diffusion plate 140 has substantially the same size as the member to be irradiated such as a liquid crystal panel. For example, diffusion plate 140 is formed with optically transparent resins such as polymethylmethacrylate (PMMA), polycarbonate (PC), polystyrene (PS), and styrene methyl methacrylate copolymerization resin (MS). For the purpose of providing light diffusibility, minute irregularities are formed in the surface of diffusion plate 140, or light diffusers such as beads are dispersed inside diffusion plate 140. Preferably, the ratio of the distance between substrate 120 and diffusion plate 140 with respect to the center-to-center distance of the plurality of light-emitting elements is 0.15 or greater.

Note that surface light source device 100 may include other optical sheets in addition to the above-mentioned configuration. Examples of the other optical sheets include a first prism sheet (PS1), a second prism sheet (PS2), and a dual brightness enhancement film (DBEF (registered trademark)).

The first prism sheet includes a plurality of first ridges, and transmits the reaching light while controlling the travelling direction of the light. The first ridgelines of the plurality of first ridges are straight lines disposed in parallel to each other. The first ridge may be disposed on the light-emitting device 131 side or on the dual brightness enhancement film side.

The second prism sheet includes a plurality of second ridges, and transmits the reaching light while controlling the travelling direction of the light. The second ridgelines of the plurality of second ridges are straight lines disposed in parallel to each other. The second ridge may be disposed on the light-emitting device 131 side or on the dual brightness enhancement film side.

Preferably, the first ridgeline of the first ridge and the second ridgeline of the second ridge intersect each other in plan view.

The dual brightness enhancement film is a reflective polarization film based on the multilayer thin film technique.

Note that the composition of the optical sheet in surface light source device 100 is, for example, the first prism sheet (PS1), the second prism sheet (PS2) and the dual brightness enhancement film (DBEF). Alternatively, the composition of the optical sheet is, for example, the first prism sheet (PS1) or the second prism sheet (PS2), and the dual brightness enhancement film (DBEF).

Arrangement of Light Emission Chip

An arrangement of light emission chips 151 in surface light source device 100 is elaborated below. First, an arrangement of light emission chips 151 in light-emitting element array 132L of surface light source device 100 is described. Preferably, the number of light-emitting elements 132 included in light-emitting element array 132L is 2n (n is a positive integer) as described above. The following describes a case where two light-emitting elements 132 are included in light-emitting device array 131L, and a case where four light-emitting elements 132 are included in light-emitting device array 131L as an example in which four or more light-emitting elements 132 are included.

Figure 5:
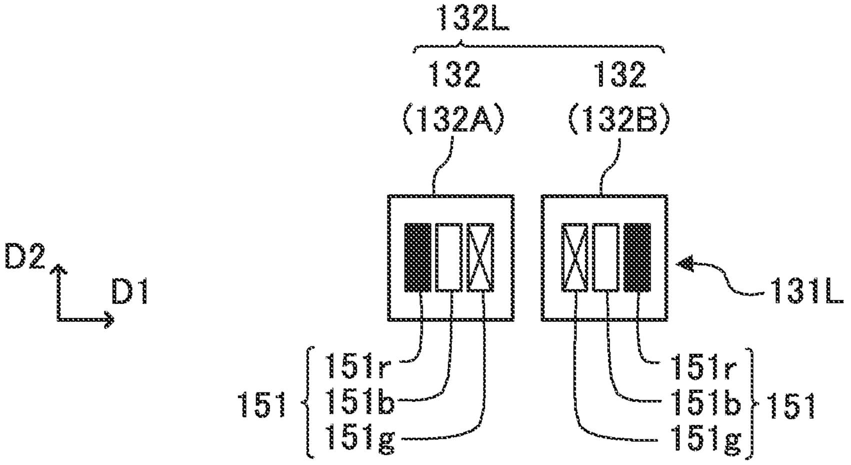
FIG. 5 is a schematic view for describing an arrangement of light emission chips in a light-emitting element array.
Figure 6A:
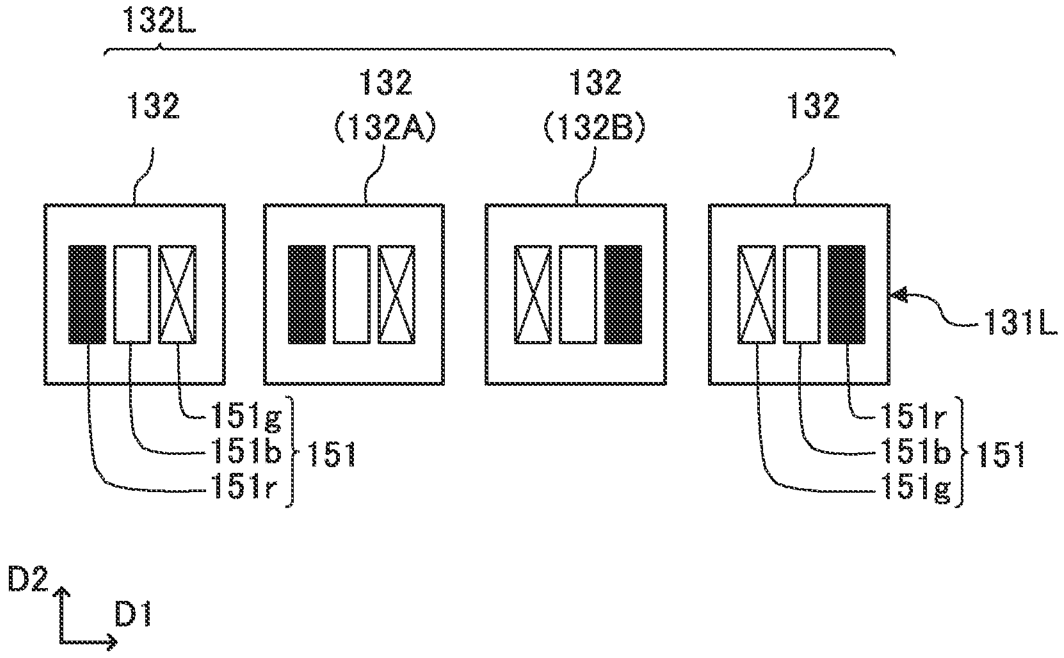
FIGS. 6A and 6B are schematic views for describing the arrangement of light emission chips in the light-emitting element array.
Figure 6B:
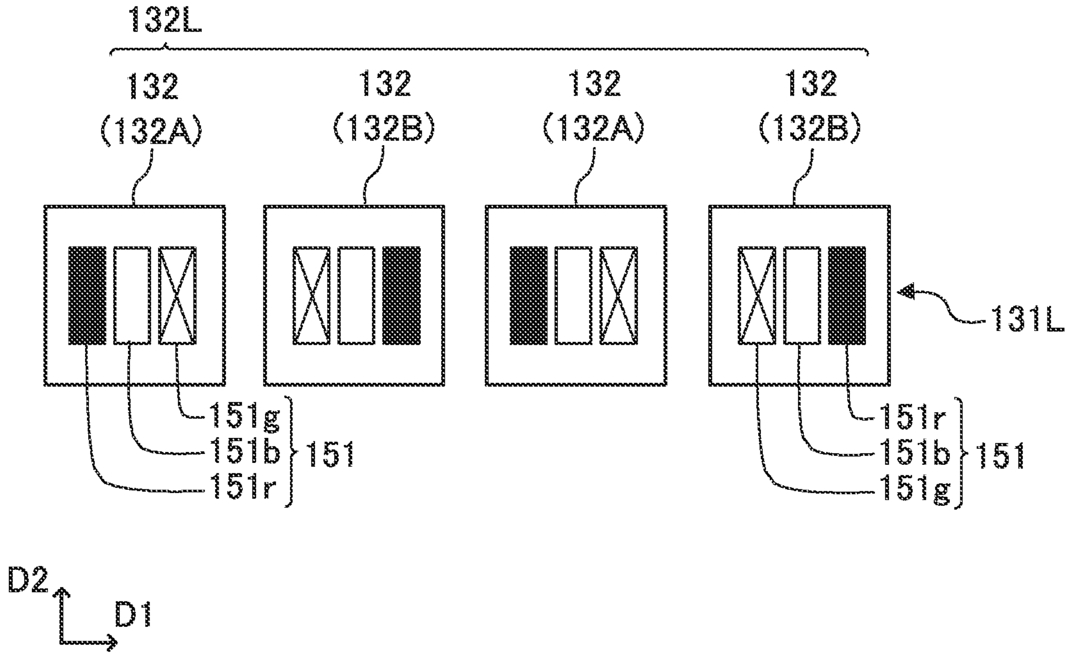

FIGS. 5, 6A and 6B are schematic views illustrating arrangements of light emission chips 151 in light-emitting element array 132L. FIG. 5 is a schematic view of a case where two light-emitting elements 132 are provided in light-emitting element array 132L, and FIGS. 6A and 6B are schematic views of a case where four light-emitting elements 132 are provided in light-emitting element array 132L.

As illustrated in FIGS. 5, 6A and 6B, in light-emitting element array 132L, the colors of light emitted from light emission chips 151 at the both end portions are the same. In the present embodiment, in light-emitting element array 132L, light emission chips 151 at the both end portions are red emission chips 151*r*, and the color of the emission light is red. In addition, the order of light emission chips 151 in light-emitting element 132 is not limited as long as the colors of light emitted from light emission chips 151 at the both end portions are the same in light-emitting element array 132L. In addition, in FIGS. 5, 6A and 6B, the arrangement order of light emission chips 151 included in each light-emitting element 132 is the same.

As illustrated in FIG. 5, the arrangement order of light emission chips 151 in two light-emitting elements 132 may be the same. In this case, in light-emitting element array 132L, first light-emitting element 132A on the left side and second light-emitting element 132B on the right side in FIG. 5 are disposed such that the color of the light emitted from the light emission chip (green light emission chip 151*g*) at a position closest to second light-emitting element 132B in first light-emitting element 132A and the color of the light emitted from the light emission chip (green light emission chip 151*g*) at a position closest to first light-emitting element 132A in second light-emitting element 132B are the same color. In this manner, in the example illustrated in FIG. 5, in plan view, light emission chips 151 are disposed such that the colors of light emitted from light emission chips 151 are line-symmetric with respect to the portion between first light-emitting element 132A and second light-emitting element 132B as the boundary. In other words, in the example illustrated in FIG. 5, the arrangement order of light emission chips 151 in light-emitting element 132 is the same, while second light-emitting element 132B is disposed in an opposite orientation with respect to first light-emitting element 132A.

Even in the case where four light-emitting elements 132 are included in light-emitting element array 132L as illustrated in FIGS. 6A and 6B, the colors of light emitted from light emission chips 151 at the both end portions are the same in light-emitting element array 132L. In the present embodiment, in light-emitting element array 132L, light emission chips 151 at the both end portions are red emission chips 151*r*, and the color of the emission light is red. In addition, the arrangement order of light emission chips 151 in light-emitting element 132 is not limited as long as the colors of the emission light from light emission chips 151 at the both end portions are the same in light-emitting element array 132L.

As illustrated in FIG. 6A, in light-emitting element array 132L, first light-emitting element 132A on the left side at the center in FIG. 6A and second light-emitting element 132B on the right side at the center in FIG. 6A are disposed such that the color of the light emitted from the light emission chip (green light emission chip 151*g*) at a position closest to second light-emitting element 132B in first light-emitting element 132A and the color of the light emitted from the light emission chip (green light emission chip 151*g*) at a position closest to first light-emitting element 132A in second light-emitting element 132B are the same color. In this manner, in the example illustrated in FIG. 6A, in plan view, they are disposed such that the colors of light emitted from light emission chips 151 are line-symmetric with respect to the portion between first light-emitting element 132A and second light-emitting element 132B as the boundary.

As illustrated in FIG. 6B, the light-emitting elements (the first light-emitting element and the second light-emitting element) adjacent to each other in light-emitting element array 132L are also disposed such that the color of the light emitted from the light emission chip at a position closest to second light-emitting element 132B in first light-emitting element 132A and the color of the light emitted from the light emission chip at a position closest to first light-emitting element 132A in second light-emitting element 132B are the same color. In this manner, in the example illustrated in FIG. 6B, in plan view, they are disposed such that the colors of light emitted from light emission chips 151 are line-symmetric with respect to the portion between first light-emitting element 132A and second light-emitting element 132B as the boundary.

Note that comparing the example illustrated in FIG. 6A and the example illustrated in FIG. 6B, the example illustrated in FIG. 6B is more preferable. The example illustrated in FIG. 6B is more excellent in uniformity with less color unevenness than in the example illustrated in FIG. 6A.

Next, the arrangement of light emission chips 151 in light source block 130 is described. Here, light source block 130 including two lines of light-emitting device array 131L including two light-emitting elements 132, and light source block 130 including four lines of light-emitting device array 131L including four light-emitting elements 132, as an example of light-emitting device array 131L including four or more light-emitting elements 132, are described.

Figure 7A:
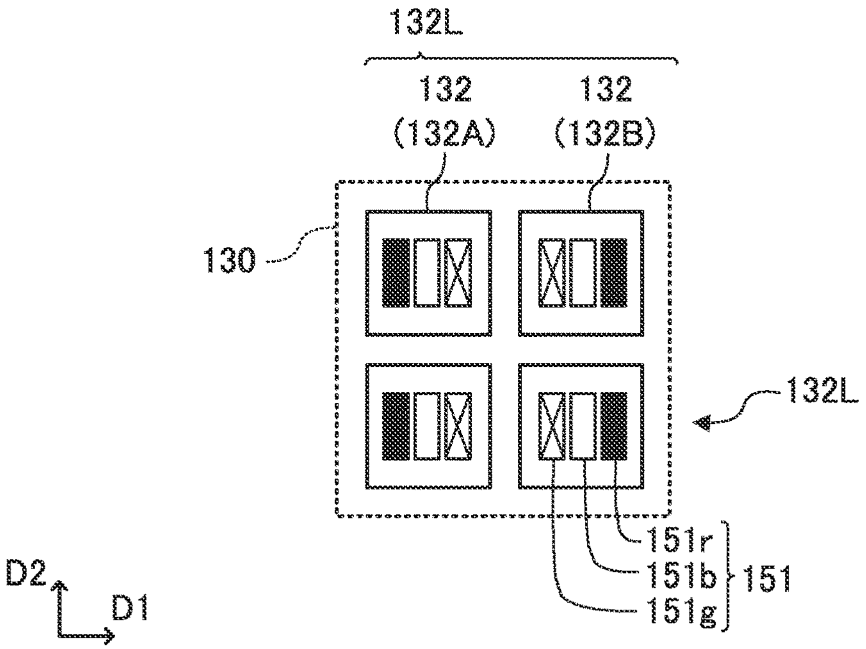
FIGS. 7A and 7B are schematic views for describing an arrangement of the light emission chips in a light source block.
Figure 7B:
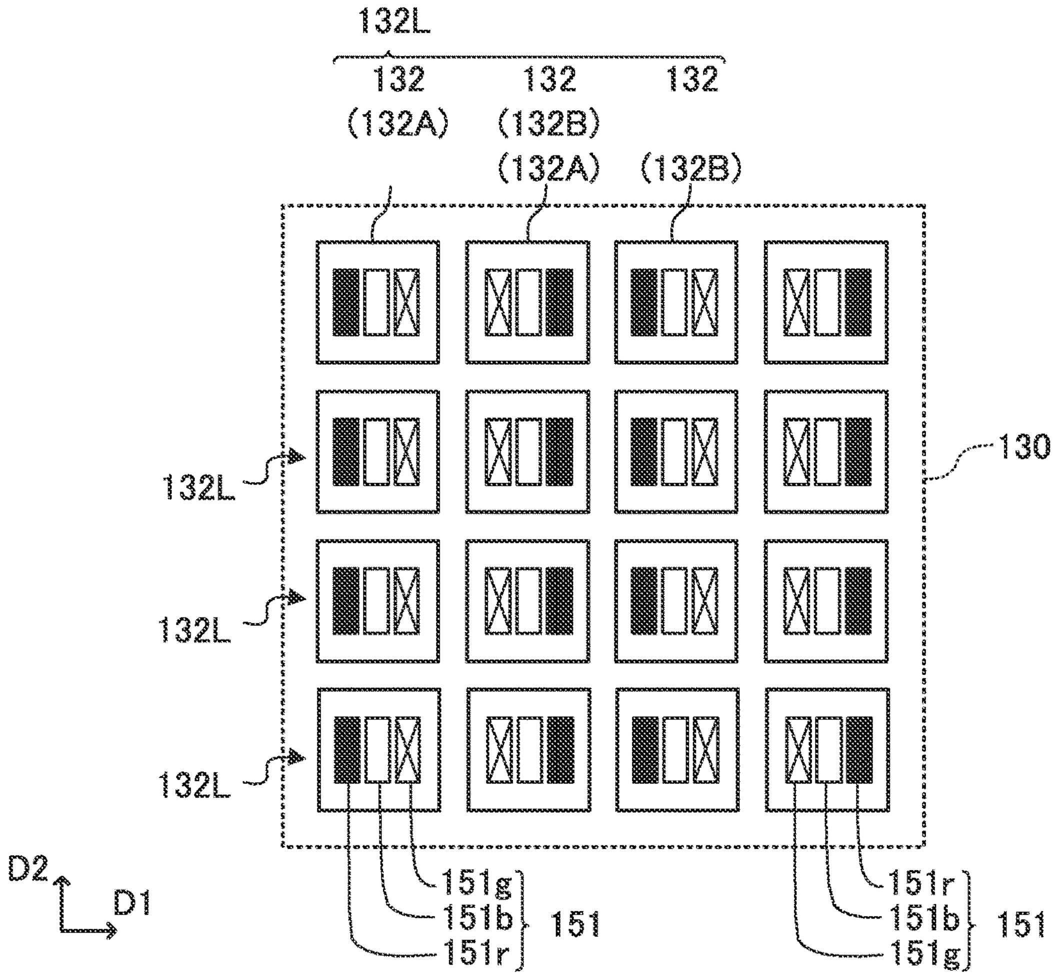

FIGS. 7A and 7B are schematic views for describing an arrangement of light emission chips 151 in light source block 130. FIG. 7A is a schematic view for describing an arrangement of light emission chips 151 in light source block 130 where light-emitting device array 131L includes two light-emitting elements 132, and two lines of light-emitting device array 131L are disposed in the second direction D2, and FIG. 7B is a schematic view for describing an arrangement of light emission chips 151 in light source block 130 in which light-emitting device array 131L includes four light-emitting elements 132, and four lines of light-emitting device array 131L are disposed in second direction D2. In addition, in FIGS. 7A and 7B, the arrangement order of the three light emission chips 151*r*, 151*g* and 151*b* included in each light-emitting element 132 is the same.

As illustrated in FIGS. 7A and 7B, in two or more (in the present embodiment 2 or 4) light-emitting element arrays 132L, the colors of the light emitted from all light emission chips 151 at the both end portions (red light emission chip 151*r*) are the same. In addition, in first light-emitting element 132A and second light-emitting element 132B adjacent to each other among the plurality of light-emitting elements 132 in light-emitting element array 132L, the color of the light emitted from the light emission chip at a position closest to second light-emitting element 132B in first light-emitting element 132A and the color of light emitted from light emission chip 151 at a position closest to first light-emitting element 132A in second light-emitting element 132B are the same. Further, as illustrated in FIG. 7B, in the case where four or more light-emitting elements 132 are provided in light-emitting element array 132L, it is preferable that in all first light-emitting elements 132A and second light-emitting elements 132B adjacent to each other in light-emitting element array 132L, the color of the light emitted from the light emission chip at a position closest to second light-emitting element 132B in first light-emitting element 132A and the color of light emitted from light emission chip 151 at a position closest to first light-emitting element 132A in second light-emitting element 132B be the same.

Next, the arrangement of light emission chips 151 in surface light source device 100 is described. Here, surface light source device 100 in which light source blocks 130 including two lines of light-emitting device array 131L including two light-emitting elements 132 are disposed in first direction D1 and second direction D2, and surface light source device 100 in which light source blocks 130 including four lines of light-emitting device array 131L including four light-emitting elements 132 are disposed in first direction D1 and second direction D2 as an example of light-emitting device array 131L including four or more light-emitting elements 132 are described.

Figure 8:
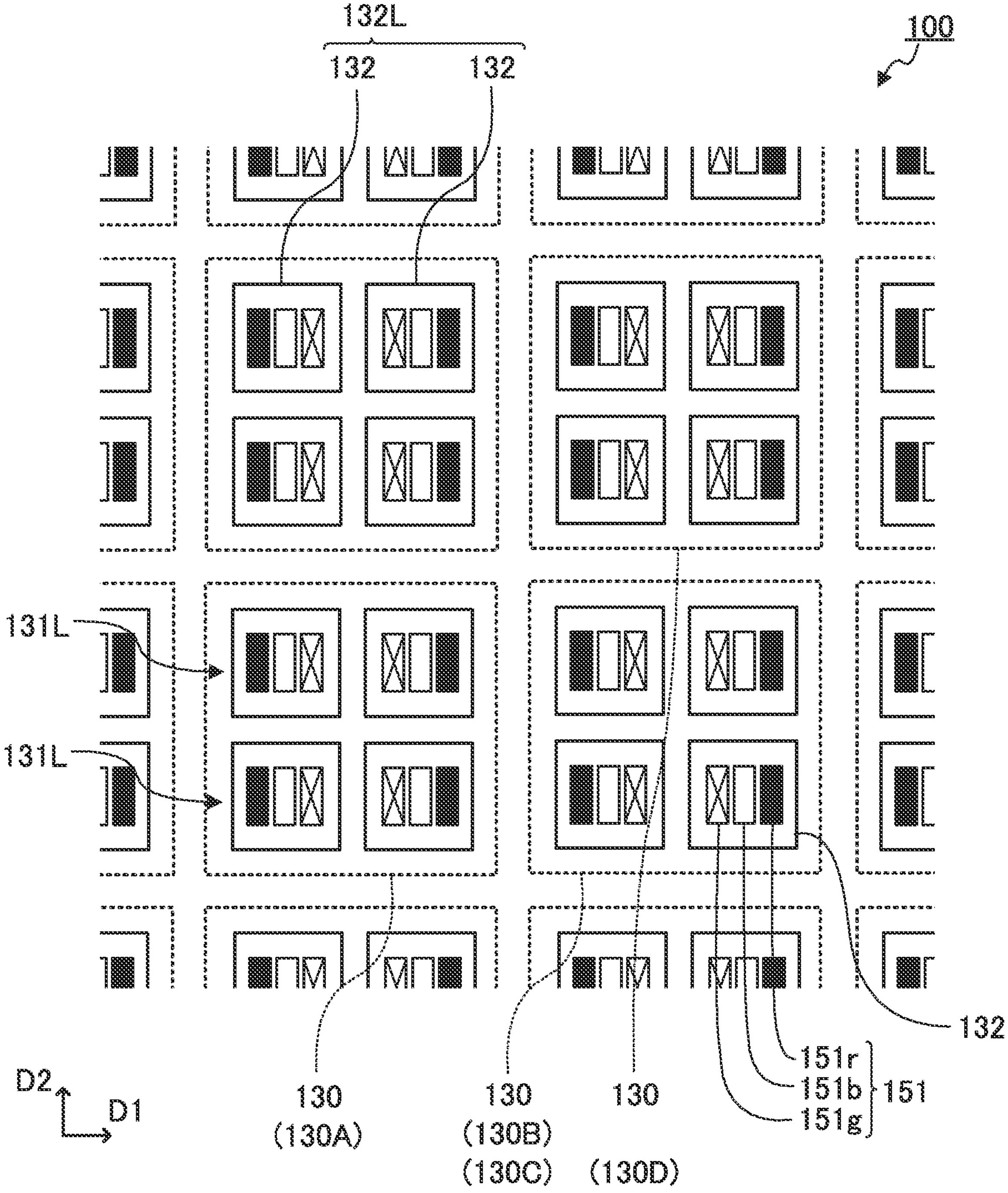
FIG. 8 is a schematic view for describing an arrangement of the light emission chips in the surface light source device.
Figure 9:
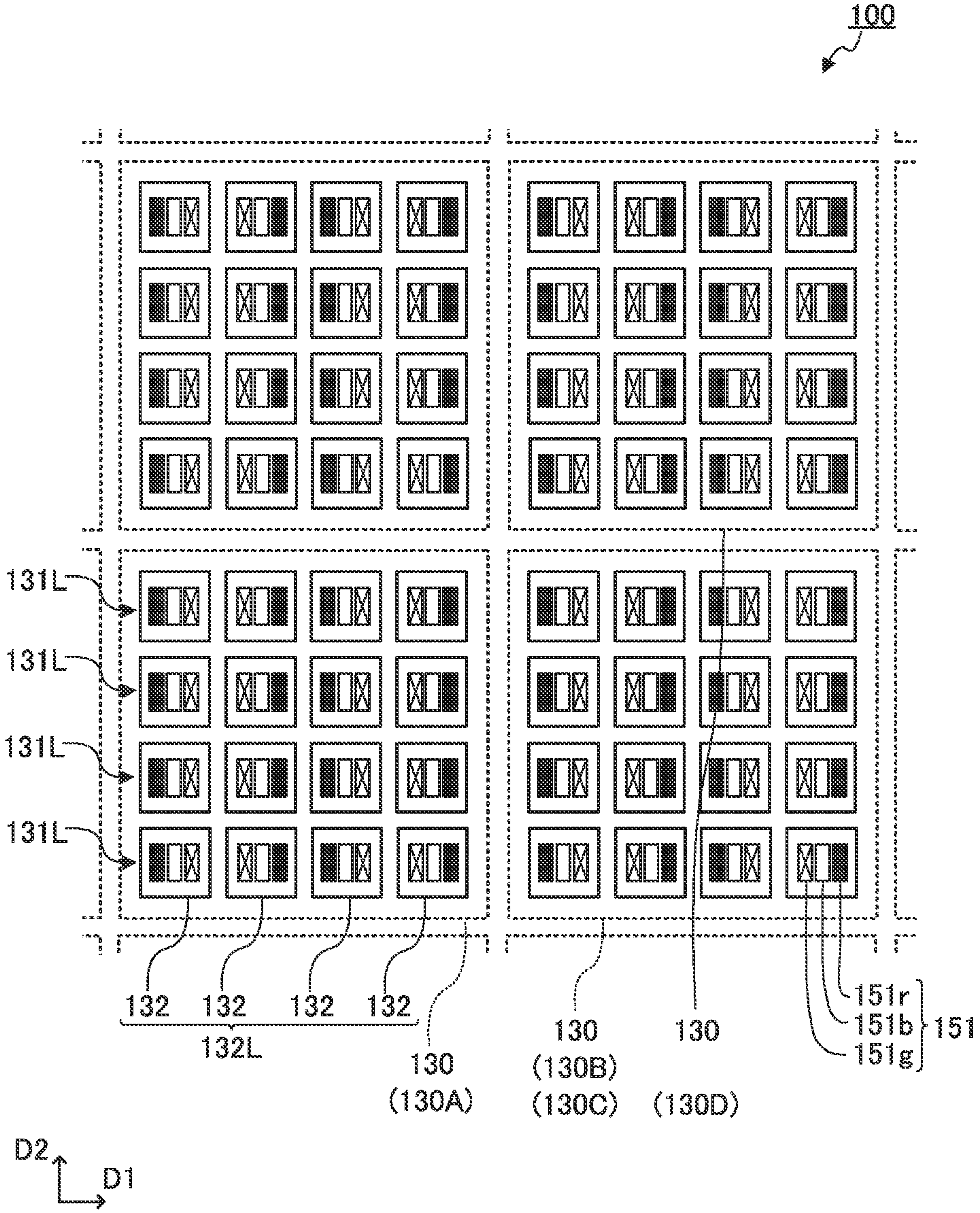
FIG. 9 is a schematic view for describing an arrangement of the light emission chips in the surface light source device.

FIGS. 8 and 9 are schematic views for describing an arrangement of light emission chips 151 in surface light source device 100. FIG. 8 is a schematic view for describing an arrangement of light emission chips 151 in surface light source device 100 in which light source block 130 illustrated in FIG. 7A is disposed in first direction D1 and second direction D2, and FIG. 9 is a schematic view for describing an arrangement of light emission chips 151 in surface light source device 100 in which light source block 130 illustrated in FIG. 7B is disposed in first direction D1 and the second direction.

In first light source block 130A and second light source block 130B adjacent to each other in first direction D1 among the plurality of light source blocks 130, the order of the plurality of light emission chips 151 may be identical to each other or different from each other. In the present embodiment, as illustrated in FIGS. 8 and 9, the order of the plurality of light emission chips 151 is the same in first light source block 130A and second light source block 130B adjacent to each other in first direction D1 among the plurality of light source blocks 130.

In third light source block 130C and fourth light source block 130D adjacent to each other in second direction D2 among the plurality of light source blocks 130, the order of the plurality of light emission chips 151 may be identical to each other or different from each other. Preferably, in the present embodiment, in third light source block 130C and fourth light source block 130D adjacent to each other in second direction D2 among the plurality of light source blocks 130, the order of the plurality of light emission chips 151 is the same as illustrated in FIGS. 8 and 9.

Chromaticity Distribution

Next, here, the chromaticity distribution in surface light source device 100 was examined. The surface light source device used in the measurement includes one light source block 130, and this light source block 130 includes one line of light-emitting element array 132L including two light-emitting elements 132. Surface light source device 100 used in the measurement does not include light flux controlling member 133. The size of light-emitting element 132 is 0.4 mm×0.4 mm, and the center-to-center distance of light-emitting element 132 is 12 mm. The arrangement order of the three light emission chips 131*r*, 151*g* and 151*b* in light-emitting element 132 is the same. The distance between substrate 120 and diffusion plate 140 is 10 mm. In addition, the surface of substrate 120 is configured to reflect reaching light toward diffusion plate 140. In addition, surface light source device 100 includes diffusion plate 140, an optical sheet, and a dual brightness enhancement film with a plurality of prisms formed on front and rear sides disposed thereon.

Figure 10A:
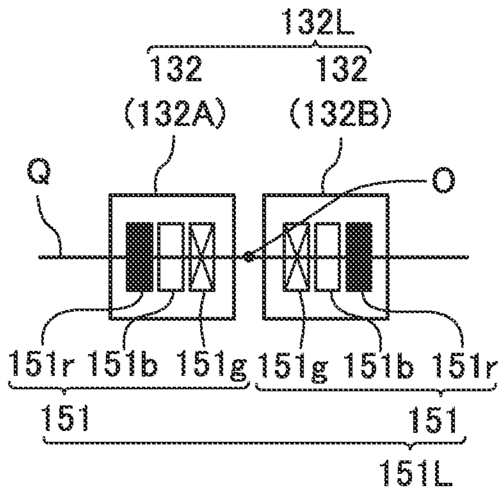
FIGS. 10A to 10C are diagrams for describing a chromaticity in the surface light source device.
Figure 10B:
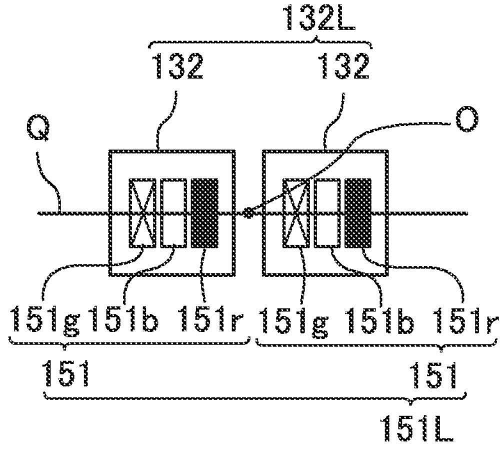
Figure 10C:
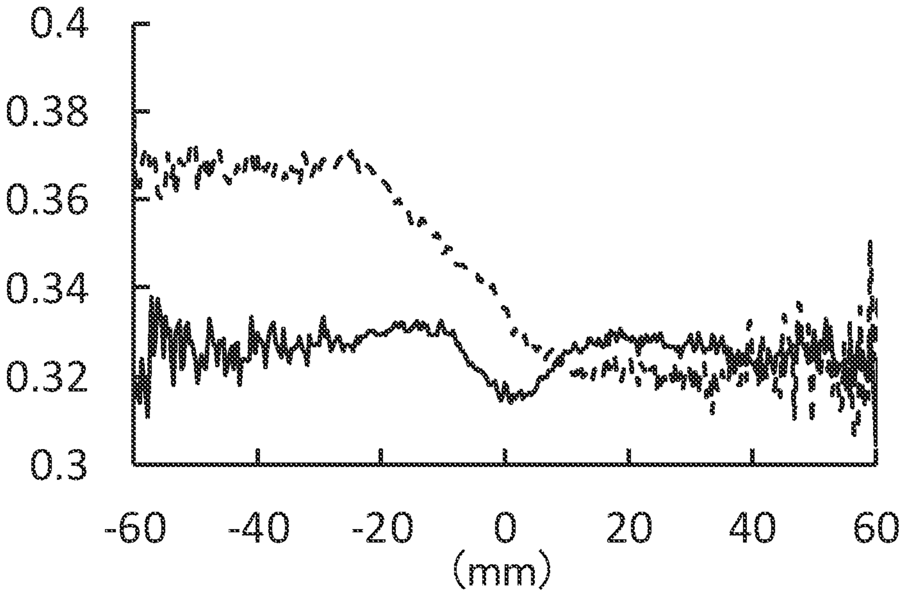

FIG. 10A is a schematic view of a surface light source device in which the colors of light emitted from light emission chips 151 at both ends of light-emitting element array 132L are the same, FIG. 10B is a schematic view of a surface light source device in which the colors of light emitted from light emission chips 151 at both ends of light-emitting element array 132L are different from each other, and FIG. 10C is a diagram illustrating a chromaticity distribution at line Q in FIGS. 10A and 10B. In FIG. 10C, the abscissa indicates a distance from point O of FIGS. 10A and 10B, and the ordinate indicates a value of chromaticity Y. In FIG. 10C, the solid line indicates a result of the surface light source device of FIG. 10A, and the dotted line indicates a result of the surface light source device of FIG. 10B.

As illustrated in FIGS. 10A and 10C, when the colors of light emitted from light emission chips 151 at the both end portions of light-emitting element array 132L are the same, and the chromaticity unevenness is less significant. Note that in the example illustrated in FIG. 10A, in light-emitting element array 132L, first light-emitting element 132A on the left side and second light-emitting element 132B on the right side in FIG. 10A are disposed such that the color of the light emitted from the light emission chip (green light emission chip 151*g*) at a position closest to second light-emitting element 132B in first light-emitting element 132A and the color of the light emitted from the light emission chip (green light emission chip 151*g*) at a position closest to first light-emitting element 132A in second light-emitting element 132B are the same color.

As illustrated in FIGS. 10B and 10C, when the colors of light emitted from light emission chips 151 at the both end portions of light-emitting element array 132L are different from each other, chromaticity unevenness occurs.

Next, a chromaticity distribution of a case where eight lines of light-emitting element array 132L composed of two light-emitting elements 132 are disposed in one light source block 130 was examined. The configuration of surface light source device 100 used in the measurement is the same as described above except for the number of light-emitting devices 131.

Figure 11A:
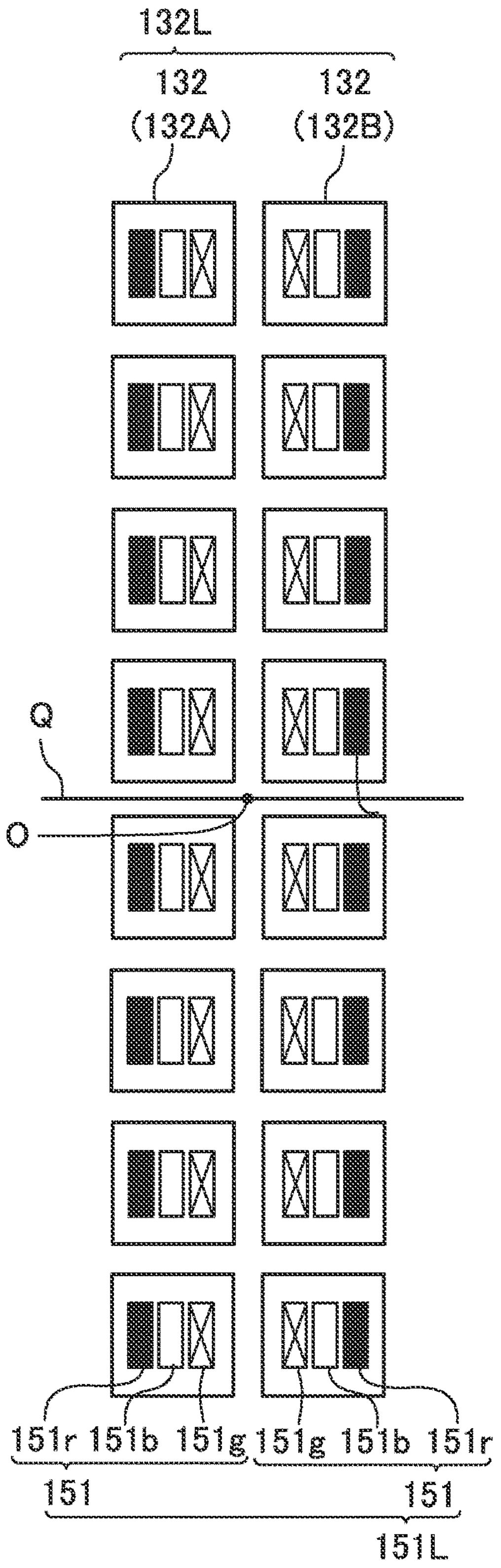
FIGS. 11A and 11B are diagrams for describing an arrangement of the light emission chips in the surface light source device.
Figure 11B:
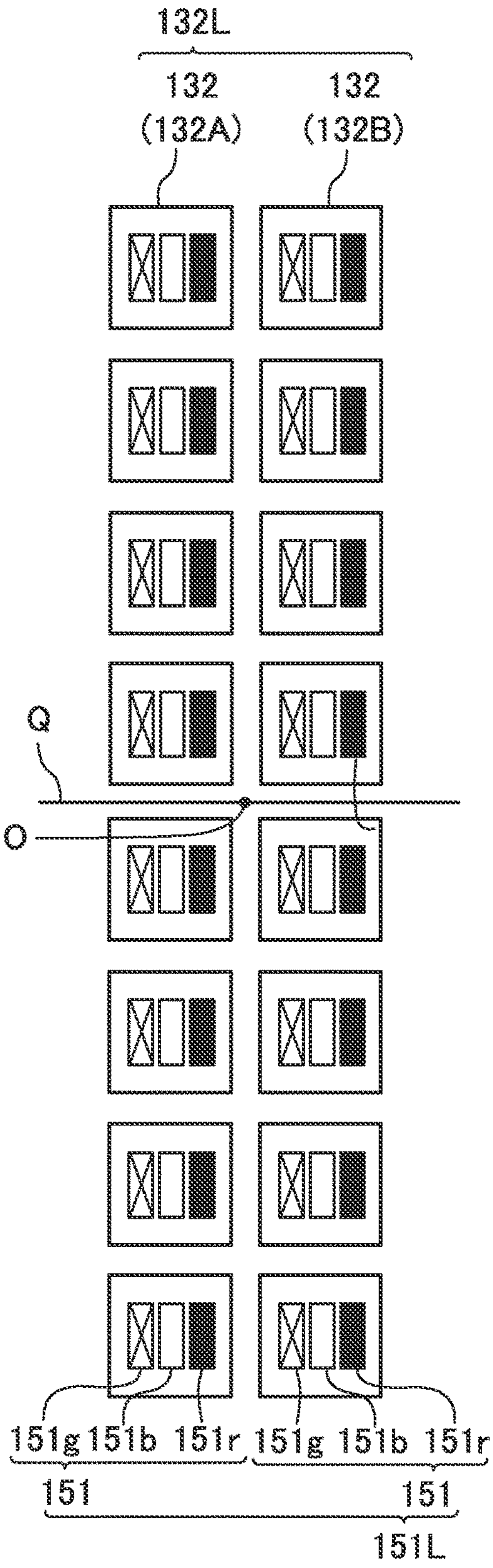
Figure 12:
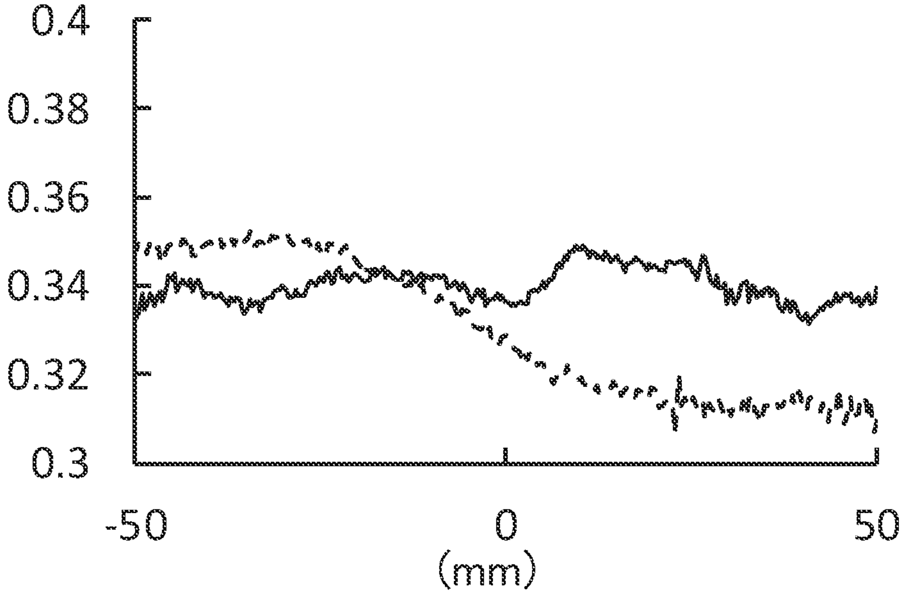
FIG. 12 is a graph illustrating a measurement result of a chromaticity in the surface light source device.

FIG. 11A is a schematic view of a surface light source device in which the colors of light emitted from light emission chips 151 at both ends of light-emitting element array 132L are the same, and FIG. 11B is a schematic view of a surface light source device in which the colors of light emitted from light emission chips 151 at both ends of light-emitting element array 132L are different from each other. FIG. 12 is a diagram illustrating a chromaticity distribution at line Q of FIGS. 11A and 11B. In FIG. 12, the abscissa indicates a distance from point O of FIGS. 11A and 11B, and the ordinate indicates a value of chromaticity Y. In FIG. 12, the solid line indicates a result of the surface light source device of FIG. 11A, and the dotted line indicates a result of the surface light source device of FIG. 11B.

As illustrated in FIGS. 11A and 12, as in the embodiment, when the colors of light emitted from light emission chips 151 at the both end portions of light-emitting element array 132L are the same, and the chromaticity unevenness is less significant. Note that in the example illustrated in FIG. 11A, in light-emitting element array 132L, first light-emitting element 132A on the left side and second light-emitting element 132B on the right side in FIG. 10A are disposed such that the color of the light emitted from the light emission chip (green light emission chip 151g) at a position closest to second light-emitting element 132B in first light-emitting element 132A and the color of the light emitted from the light emission chip (green light emission chip 151g) at a position closest to first light-emitting element 132A in second light-emitting element 132B are the same color.

As illustrated in FIGS. 11B and 12, when the colors of light emitted from light emission chips 151 at the both end portions of light-emitting element array 132L are different from each other, chromaticity unevenness occurs.

Next, the influence of light flux controlling member 133 on the chromaticity distribution of light emitted from one light-emitting element 132 was examined. The size of light-emitting element 132 in surface light source device 100 used in the measurement is mm×0.4 mm. The distance between substrate 120 and diffusion plate 140 is 12 mm. The diameter of used light flux controlling member 133 is 13 mm. In addition, the surface of substrate 120 is configured to reflect reaching light toward diffusion plate 140. In addition, for surface light source device 100, diffusion plate 140, and the first prism sheet, the second prism sheet, the dual brightness enhancement film as optical sheets disposed thereon were used.

Figure 13A:
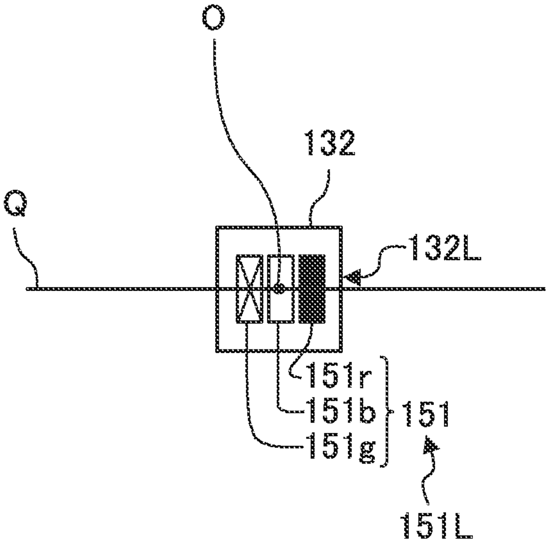
FIGS. 13A to 13C are diagrams for describing the chromaticity in the surface light source device.
Figure 13B:
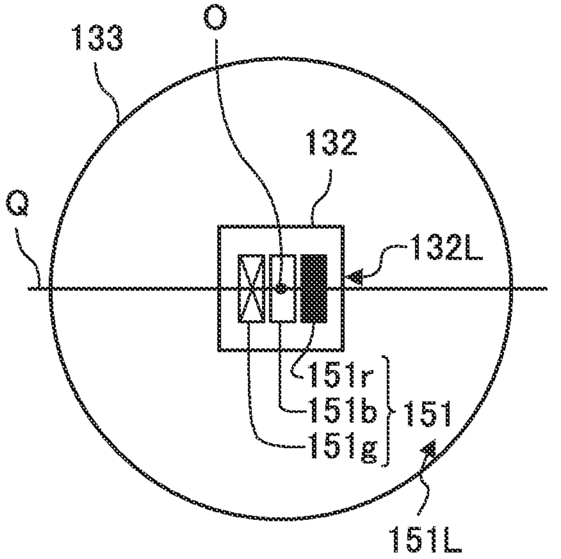
Figure 13C:
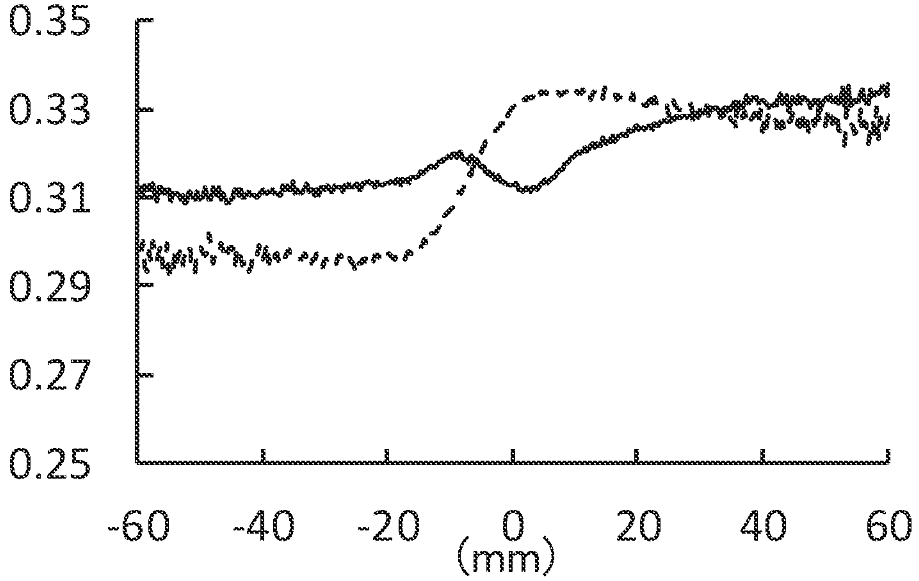

FIG. 13A is a schematic view of a case where no light flux controlling member 133 is provided, FIG. 13B is a schematic view of a case where light flux controlling member 133 is provided, and FIG. 13C is a diagram illustrating a chromaticity distribution at line Q of FIGS. 13A and 13B. In FIG. 13C, the abscissa indicates a distance from point O of FIGS. 13A and 13B, and the ordinate indicates a value of chromaticity Y. In FIG. 13C, the solid line indicates a result of a case where no light flux controlling member 133 is provided, and the dotted line indicates a result of a case where light flux controlling member 133 is provided.

As illustrated in FIGS. 13A to 13C, the chromaticity unevenness is suppressed with light flux controlling member 133.

Next, the influence of light flux controlling member 133 on the chromaticity distribution of light emitted from light-emitting element array 132L composed of two light-emitting elements 132 was examined. The size of light-emitting element 132 is 0.4 mm×0.4 mm, and the center-to-center distance of light-emitting element 132 is 24 mm. The distance between substrate 120 and diffusion plate 140 is 12 mm. In addition, the surface of substrate 120 is configured to reflect reaching light toward diffusion plate 140. In addition, for surface light source device 100, diffusion plate 140, and the first prism sheet, the second prism sheet, the dual brightness enhancement film as optical sheets disposed thereon were used.

Figure 14:
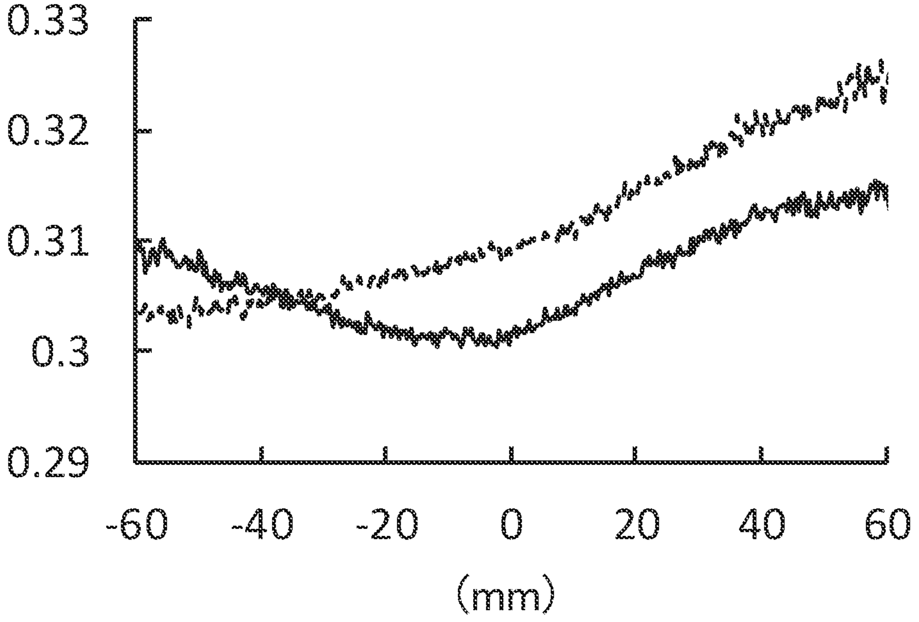
FIG. 14 is a graph illustrating a measurement result of a chromaticity in the surface light source device.

The arrangement of light emission chips 151 in light-emitting element array 132L is the same as in FIGS. 10A and 10B. FIG. 14 is a diagram illustrating a chromaticity distribution at line Q in FIGS. 10A and 10B. In FIG. 14, the abscissa indicates a distance from point O of FIGS. 10A and 10B, and the ordinate indicates a value of chromaticity Y. In FIG. 14, the solid line indicates a result of the surface light source device in which no light flux controlling member 133 is disposed, and the dotted line indicates a result of the surface light source device in which light flux controlling member 133 is disposed.

As illustrated in FIGS. 10A, 10B and 14 where light flux controlling member 133 is provided, the chromaticity unevenness largely differs depending on the arrangement of light emission chips 151.

Effects

As described above, in surface light source device 100 according to the present embodiment, the colors of light emitted from light emission chips 151 at the both end portions are the same in light-emitting element array 132L composed of the plurality of light-emitting elements 132, and therefore the colors of the light emitted from light-emitting devices 131 are mixed, thus suppressing color unevenness. In addition, the colors of light are not mixed between two light source blocks 130 adjacent to each other.

Figure 15A:
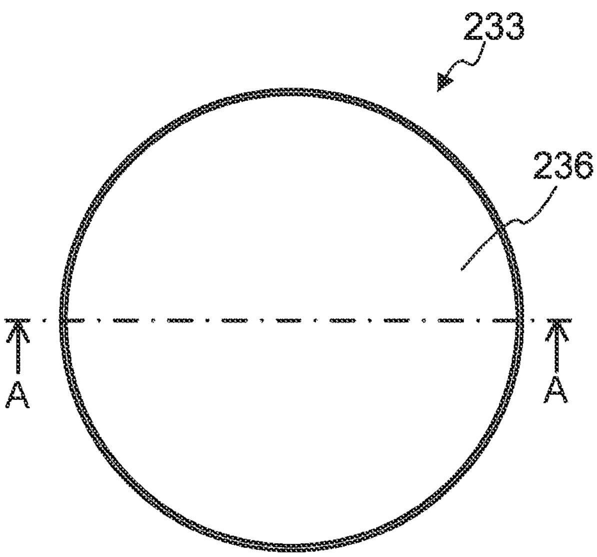
FIGS. 15A to 15D are diagrams illustrating a configuration of another light flux controlling member.
Figure 15B:
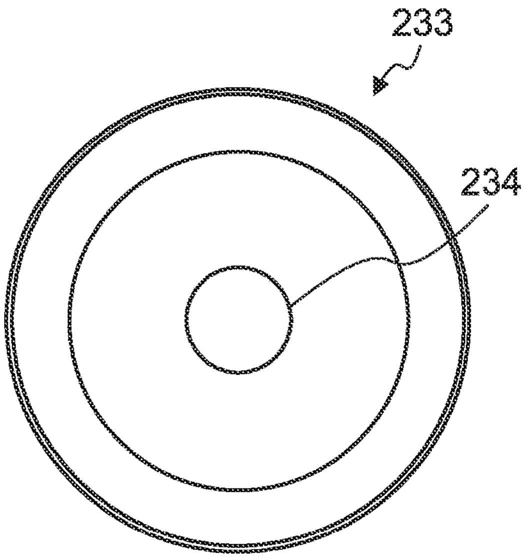
Figure 15C:
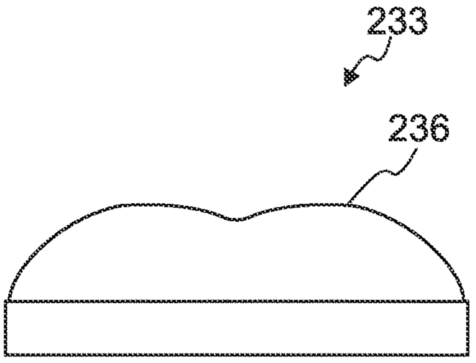
Figure 15D:
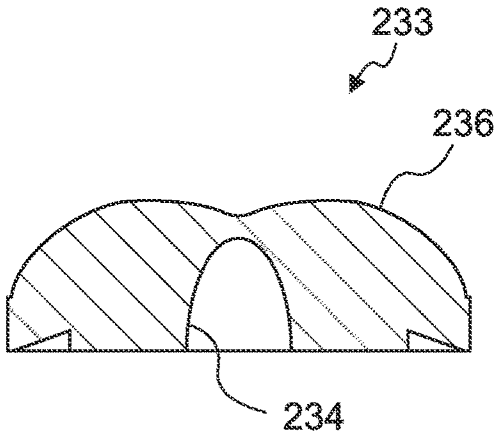

Note that as the light flux controlling member, the following light flux controlling member 233, which is a so-called diffusion lens, may be used. FIGS. 15A to 15D are diagrams illustrating a configuration of another light flux controlling member 233. FIG. 15A is a plan view of light flux controlling member 233, FIG. 15B is a bottom view, FIG. 15C is a side view, and FIG. 15D is a sectional view taken along line A-A of FIG. 15A.

As illustrated in FIGS. 15A to 15D, light flux controlling member 233 includes incidence surface 234 and emission surface 236. Light flux controlling member 233 is configured to emit, toward emission surface 236, light entered from incidence surface 234 while spreading the light.

Embodiment 2

Next, surface light source device 300 of Embodiment 2 is described. Surface light source device 300 of the present embodiment is different from surface light source device 100 of Embodiment 1 in the configuration of light source block 330. In view of this, the configuration of light source block 330 is mainly described, and the same components as those of Embodiment 1 are denoted with the same reference numerals and the description thereof will be omitted.

Figure 16:
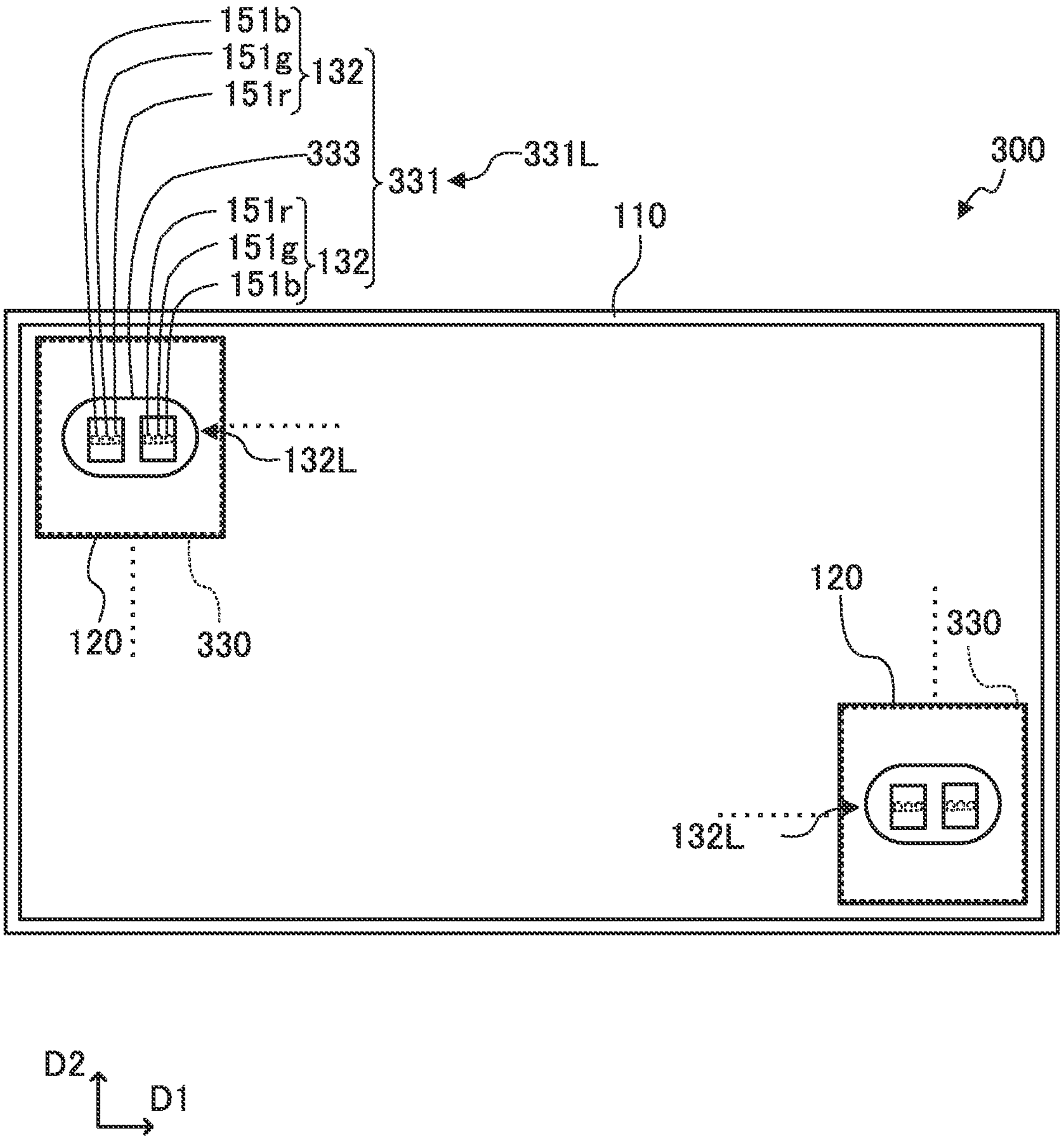
FIG. 16 is a plan view of a surface light source device according to Embodiment 2 from which a top plate is detached.
Figure 17:
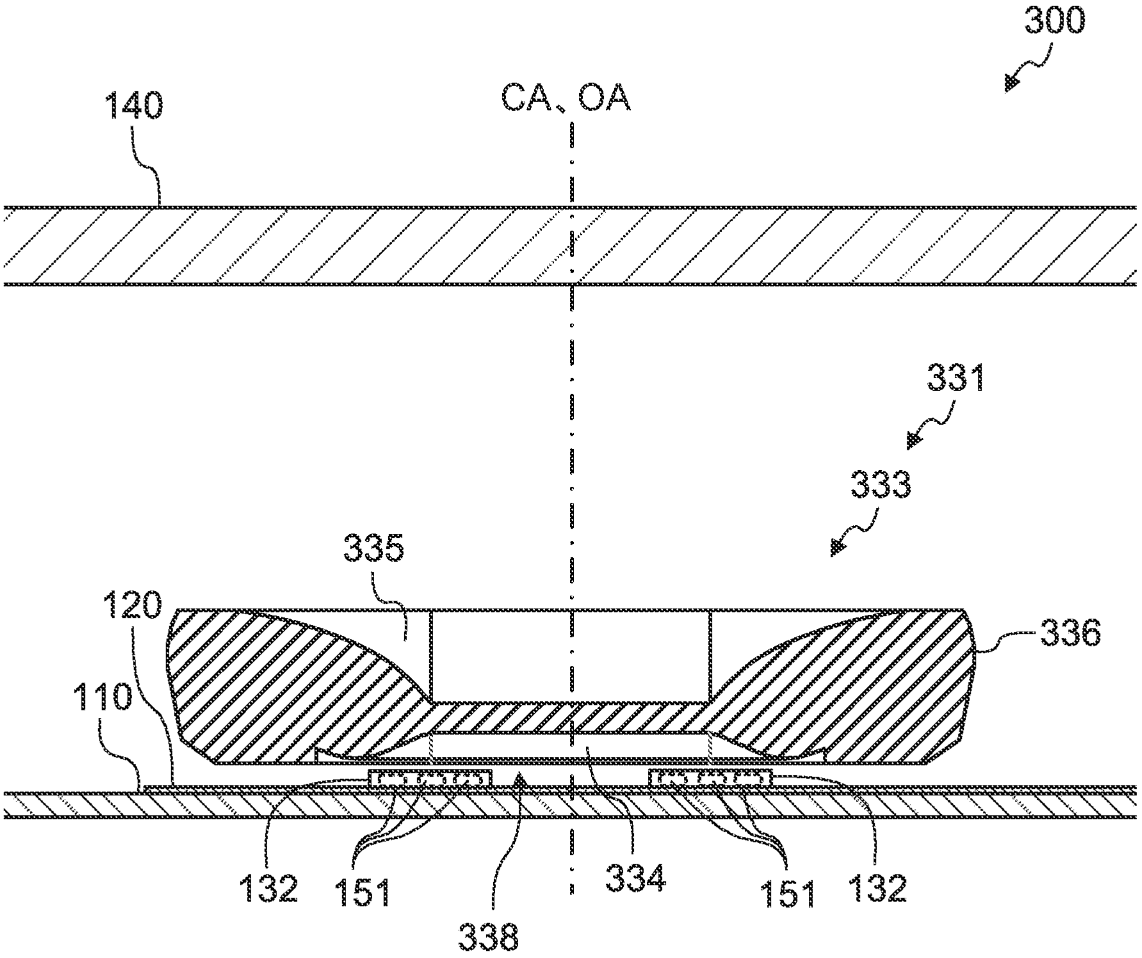
FIG. 17 is a partially enlarged sectional view of the surface light source device.

FIG. 16 is a plan view of surface light source device 300 from which the top plate is detached. FIG. 17 is a partially enlarged sectional view of surface light source device 300.

As illustrated in FIGS. 16 and 17, surface light source device 300 of the present embodiment includes housing 110, the plurality of substrates 120, a plurality of light source blocks 330, and diffusion plate 140.

The plurality of light source blocks 330 are disposed in first direction D1 and second direction D2 orthogonal to first direction D1 (see FIG. 16). The number of light source blocks 330 disposed on substrate 120 is not limited. Each of the plurality of light source blocks 330 includes light-emitting device 331. Each of the plurality of light source blocks 330 includes one line of light-emitting element array 132L composed of the plurality of light-emitting elements 132 arranged in first direction D1.

Light-emitting device 331 in the present embodiment includes light-emitting element 132, and one light flux controlling member 333 for controlling light emitted from one line of light-emitting element array 132L. In the present embodiment, one light flux controlling member 333 is provided for an even number (two) of light-emitting elements 132 (one line of light-emitting element array 132L). In addition, in the present embodiment, each light-emitting device 331 is disposed such that optical axis OA of light emitted from light-emitting element 132 is along the normal to the surface of substrate 120.

Figure 18A:
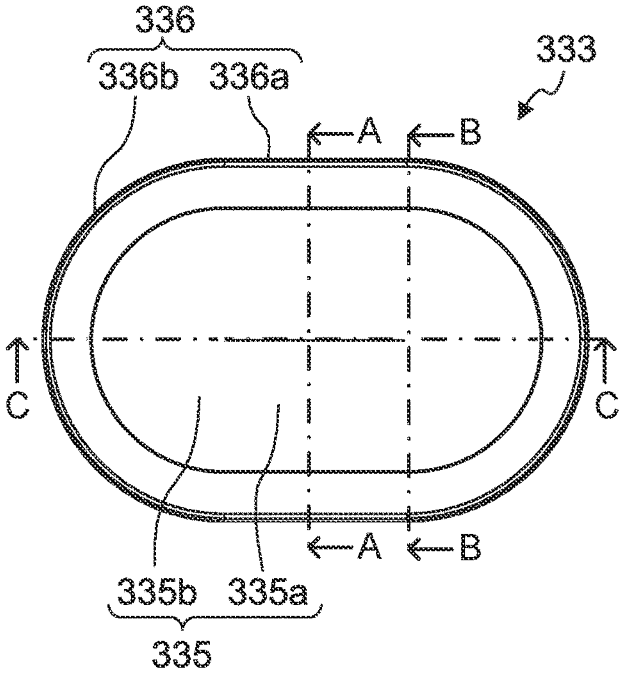
FIGS. 18A to 18D are diagrams illustrating a configuration of a light flux controlling member of Embodiment 2.
Figure 18B:
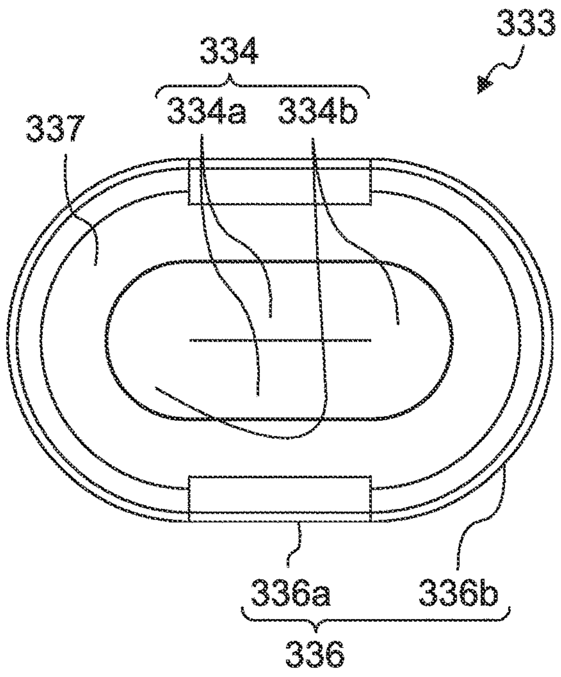
Figure 18C:
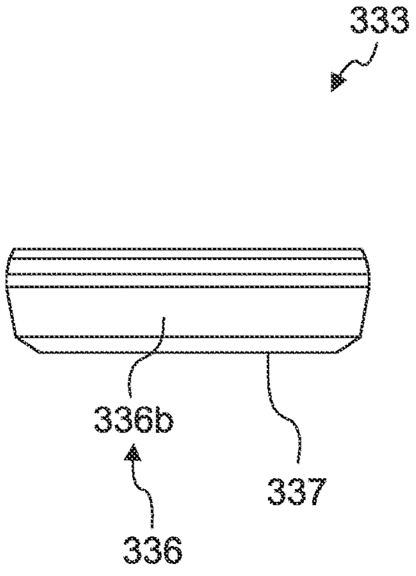
Figure 18D:
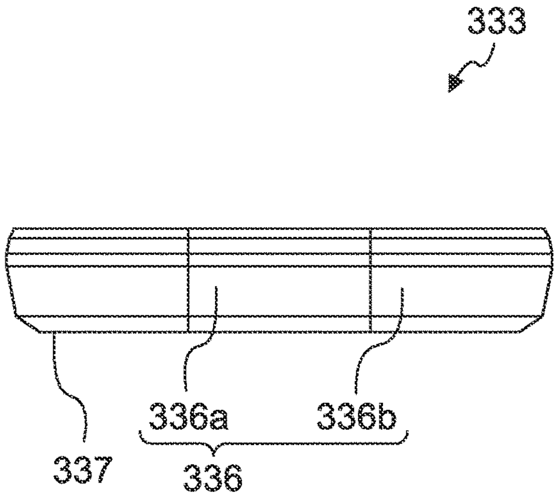
Figure 19A:
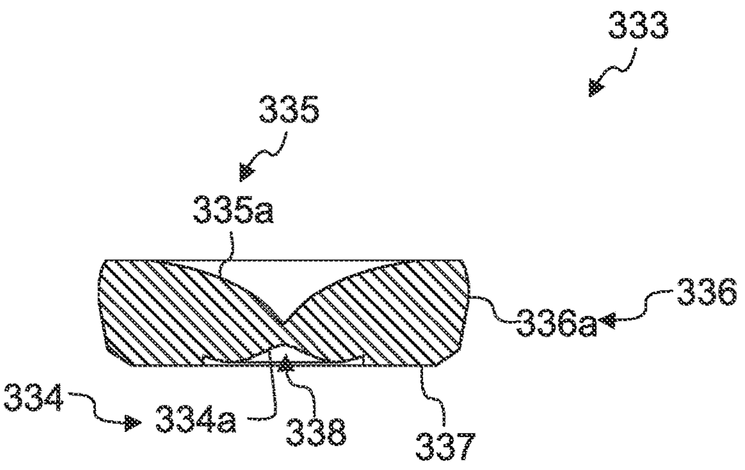
FIGS. 19A to 19C are sectional views illustrating a configuration of the light flux controlling member of Embodiment 2.
Figure 19B:
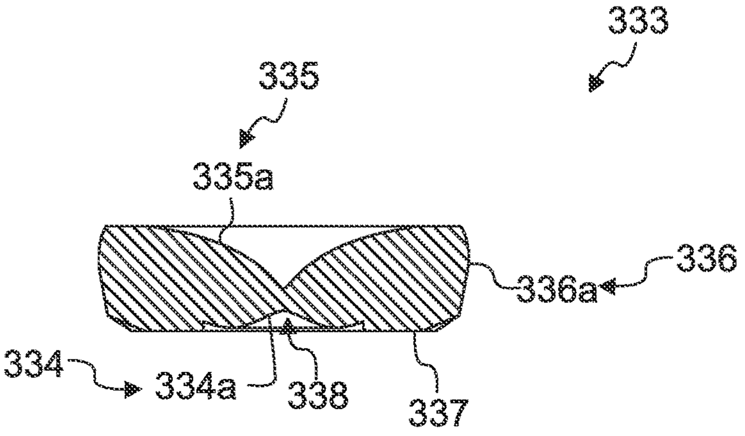
Figure 19C:
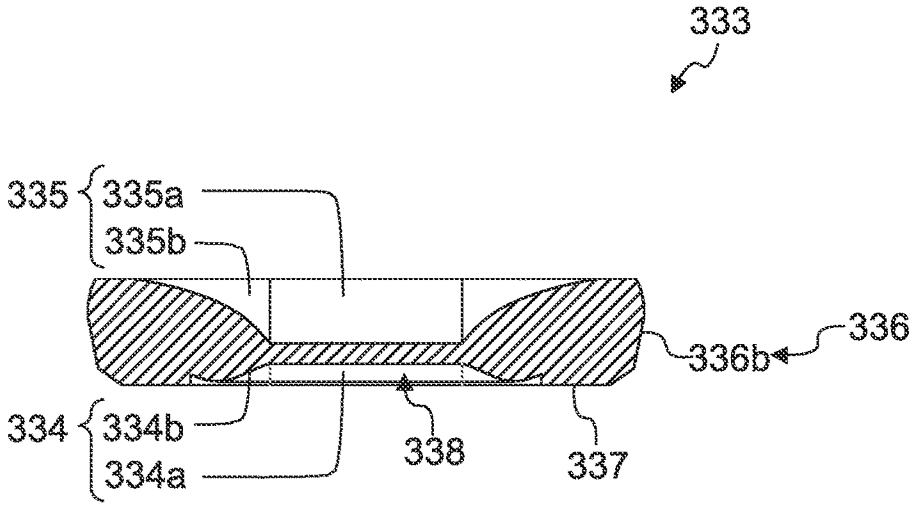
Figure 20A:
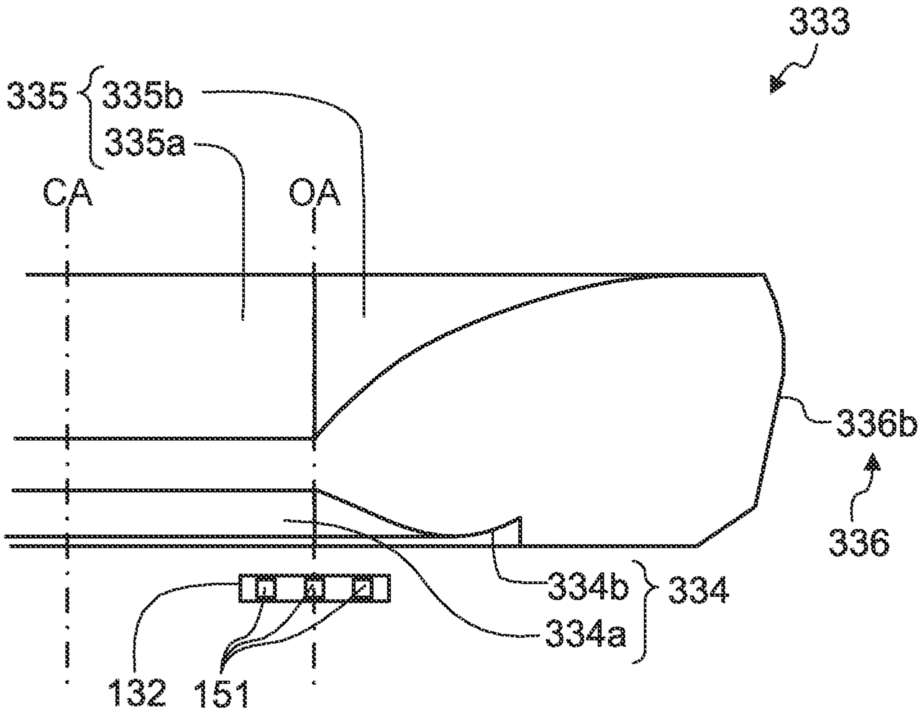
FIGS. 20A and 20B are sectional views for describing a positional relationship of a first incidence surface and a second total reflection surface.
Figure 20B:
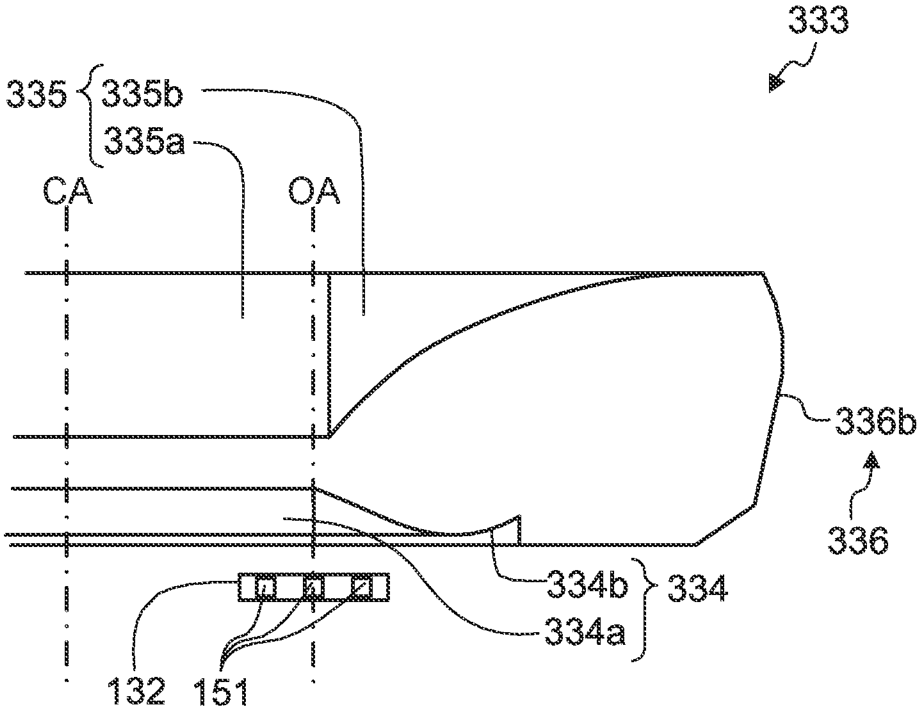

FIG. 18A is a plan view of light flux controlling member 333 of Embodiment 2, FIG. 18B is a bottom view, FIG. 18C is a side view, and FIG. 18D is a front view. FIG. 19A is a sectional view taken along line A-A of FIG. 18A, FIG. 19B is a sectional view taken along line B-B of FIG. 18A, and FIG. 19C is a sectional view taken along line C-C of FIG. 18A. FIG. 20A is a partially enlarged sectional view of light flux controlling member 333 of Embodiment 2, and FIG. 20B is a partially enlarged sectional view of another light flux controlling member 333 of Embodiment 2.

Light flux controlling member 333 controls the distribution of light emitted from an even number of light-emitting elements 132. In the present embodiment, light flux controlling member 333 is a total reflection lens. As illustrated in FIGS. 18A to 18D and 19A to 19C, in the present embodiment, light flux controlling member 333 includes incidence surface 334, total reflection surface 335, and emission surface 336. Note that light flux controlling member 333 may include leg part 139 (omitted in the drawing) for fixing substrate 120. Light flux controlling member 333 controls at least light emitted from light-emitting element 132 such that the light advances in first direction D1, the direction perpendicular to first direction D1 (central axis CA or optical axis OA), and toward substrate 120 side. In the present embodiment, light flux controlling member 333 is configured such that light advances farther in second direction D2 than in first direction D1.

Incidence surface 334 allows incidence of a part of light emitted from light-emitting element 132. Incidence surface 334 is the inner surface of recess 338 formed in a center portion of bottom surface (light-emitting element 132 side surface) 337 of light flux controlling member 333. Incidence surface 334 is disposed to intersect optical axes OA of the even number of light-emitting elements 132. The shape of incidence surface 334 is not limited. In the present embodiment, incidence surface 334 includes first incidence surface 334*a* and second incidence surface 334*b*.

First incidence surface 334*a* is disposed opposite to the light-emitting surface of light-emitting element 132. In the cross section including optical axis OA and the axis extending along first direction D1, first incidence surface 334*a* is formed in a straight line shape. In the cross section including optical axis OA and the axis extending along second direction D2, first incidence surface 334*a* is formed in a convex shape protruding toward bottom surface 337 side. In addition, preferably, in first direction D1, the optical axes of light-emitting elements 132 at both ends included in light-emitting element array 132L in light source block 330 coincide with respective end portions of first incidence surface 334*a*.

Second incidence surface 334*b* connects first incidence surface 334*a* and bottom surface 337. In the cross section including optical axis OA and the axis extending along first direction D1, second incidence surface 334*b* is formed in a convex shape protruding toward bottom surface 337 side.

Total reflection surface 335 is disposed on the side (diffusion plate 140 side) opposite to light-emitting element 132 side with incidence surface 334 therebetween. In addition, total reflection surface 335 reflects, in a direction (lateral direction) perpendicular to the optical axis (central axis CA), a part of light entered from incidence surface 334. In the present embodiment, total reflection surface 335 includes two first total reflection surfaces 335*a* and two second total reflection surfaces 335*b*.

Each first total reflection surface 335*a* extends along first direction D1, and includes two end portions in first direction D1. In the cross section including optical axis OA and the axis extending along first direction D1, first total reflection surface 335*a* is formed in a straight line shape. In the cross section including optical axis OA and the axis extending along second direction D2, first total reflection surface 335*a* is disposed such that as the distance from optical axis OA in first direction D1 increases, the distance from light-emitting element 132 in the direction along optical axis OA increases. Here, the end portion means the boundary (region) between it and second total reflection surface 335*b*.

Each second total reflection surface 335*b* connects the both end portions of two first total reflection surfaces 335*a* in first direction D1. Second total reflection surface 335*b* is disposed such that as the distance from optical axis OA in first direction D1 increases, the distance from light-emitting element 132 in the direction along optical axis OA increases. In first direction D1, second total reflection surface 335*b* includes an inner end portion disposed on optical axis OA side and an outer end portion disposed at a position farther from optical axis OA than the inner end portion. Note that the inner end portion means a position (point) closest to central axis CA of second total reflection surface 335*b* in a cross-section taken along a cross section including central axis CA of light flux controlling member 333 and the line extending in first direction D1, and the outer end portion means a position (point) farthest from central axis CA of second total reflection surface 335*b* in the cross-section. Preferably, in first direction D1, optical axes OA of light-emitting elements 132 at both ends included in light-emitting element array 132L in light source block 330 are disposed on the inside than the inner end portion of second total reflection surface 335*b*.

Emission surface 336 emits to the outside the light reflected by total reflection surface 335. Emission surface 336 connects bottom surface 337 and total reflection surface 335 (second total reflection surface 335*b*). Emission surface 336 is disposed to surround central axis CA. In the present embodiment, emission surface 336 includes two first emission surfaces 336*a* and two second emission surfaces 336*b*.

First emission surface 336*a* extends along first direction D1. In front view of light flux controlling member 333, first emission surface 336*a* is disposed between two second total reflection surfaces 335*b*. In addition, in the cross section including optical axis OA and the axis extending along second direction D2, first total reflection surface 335*a* connects bottom surface 337 and total reflection surface 335 (first total reflection surface 335*a*). First emission surface 336*a* may be composed of one flat surface, or a plurality of curved surfaces. In the present embodiment, first emission surface 336*a* is composed of a plurality of curved surfaces.

Second emission surfaces 336*b* are disposed at both end portions of light flux controlling member 333 in first direction D1. In front view of light flux controlling member 333, second emission surfaces 336*b* are disposed at both end portions of first emission surface 336*a*. Second emission surface 336*b* may be composed of one flat surface, or a plurality of curved surfaces. In the present embodiment, second emission surface 336*b* is composed of a plurality of curved surfaces.

As illustrated in FIGS. 20A and 20B, in first direction D1, the end portion of first incidence surface 334*a* and the inner end portion of second total reflection surface 335*b* may coincide or may not coincide with each other. In the present embodiment, in first direction D1, the end portion of first incidence surface 334*a* and the inner end portion of second total reflection surface 335*b* coincide with each other. As illustrated in FIG. 20B, in first direction D1, the end portion of first incidence surface 334*a* and the inner end portion of second total reflection surface 335*b* may not coincide with each other. In this case, in first direction D1, the end portion of first incidence surface 334*a* is disposed on the central axis CA side than the inner end portion of second total reflection surface 335*b*.

Simulation 1

Here, the luminance distribution and the chromaticity distribution when the positional relationship between the right end portion of first incidence surface 334*a* and the inner end portion of second total reflection surface 335*b* is changed were simulated. First, the luminance distribution in surface light source device 300 was examined. The light source device used in the measurement surface includes one light source block 130, and the light source block 130 includes light-emitting element array 132L including two light-emitting elements 132 and one light flux controlling member 333. The size of light-emitting element 132 is 0.4 mm×0.4 mm, and the center-to-center distance of light-emitting element 132 is 12 mm. The arrangement order of the three light emission chips 131*r*, 151*g* and 151*b* in light-emitting element 132 is the same. The distance between substrate 120 and diffusion plate 140 is 6 mm. In addition, the surface of substrate 120 is configured to reflect reaching light toward diffusion plate 140. In addition, surface light source device 100 includes diffusion plate 140, an optical sheet, and a dual brightness enhancement film with a plurality of prisms formed on front and rear sides disposed thereon.

Figure 21A:
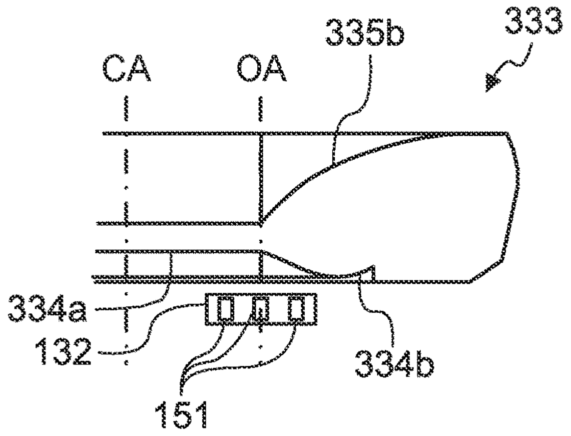
FIGS. 21A to 21E are diagrams for describing a positional relationship between a right end portion of the first incidence surface and an inner end portion of the second total reflection surface.
Figure 21B:
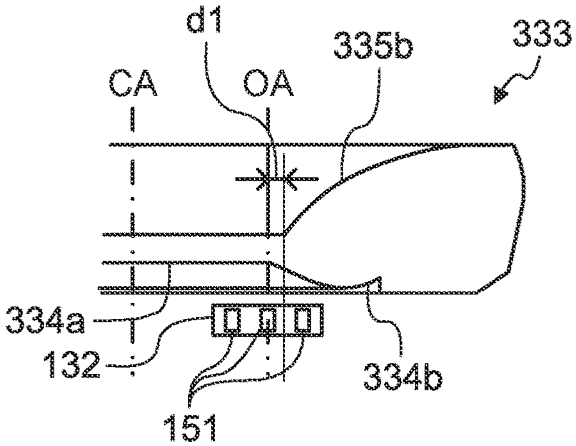
Figure 21C:
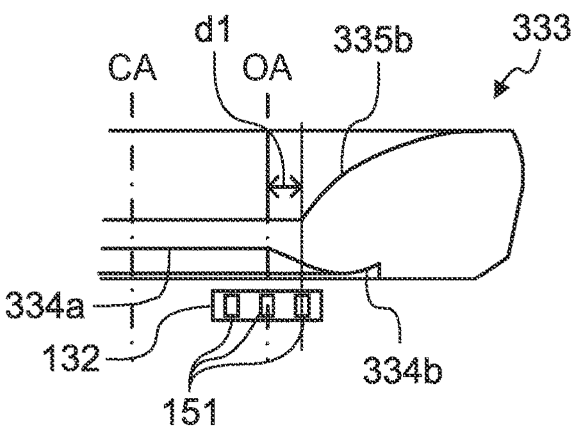
Figure 21D:
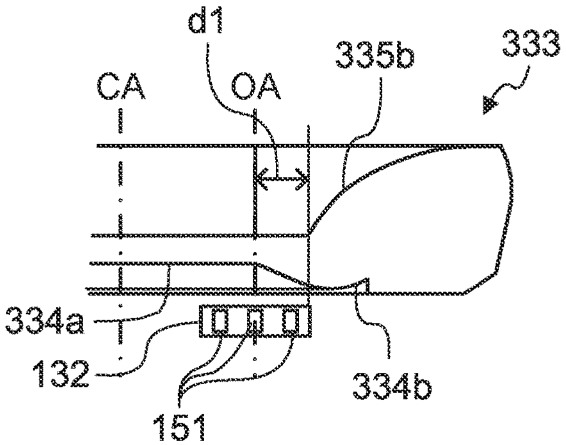
Figure 21E:
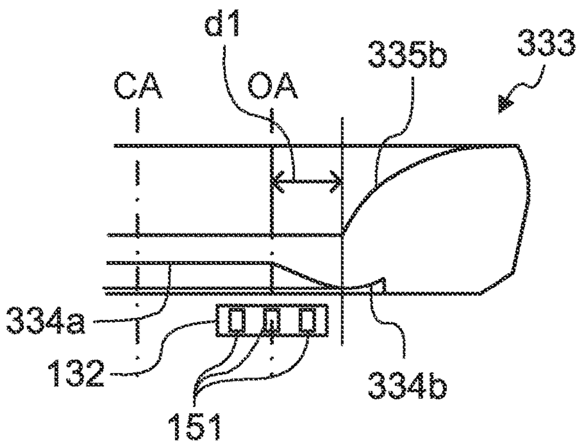

FIGS. 21A to 21E are diagrams for describing a positional relationship between the end portion of first incidence surface 334*a* and the inner end portion of second total reflection surface 335*b*. Note that the positional relationship of the right end portion of first incidence surface 334*a* and the inner end portion of second total reflection surface 335*b*, and the positional relationship of the left end portion of first incidence surface 334*a* and the inner end portion of second total reflection surface 335*b* are the same. In view of this, the positional relationship of the right end portion of first incidence surface 334*a* and the inner end portion of second total reflection surface 335*b* is described below. FIG. 21A is a schematic cross-sectional view illustrating a state where in first direction D1, the right end portion of first incidence surface 334*a* and the inner end portion of second total reflection surface 335*b* coincide with each other, FIG. 21B is a schematic cross-sectional view illustrating a state where in first direction D1, the right end portion of first incidence surface 334*a* and the inner end portion of second total reflection surface 335*b* are shifted from each other by 0.25 mm, FIG. 21C is a schematic cross-sectional view illustrating a state where in first direction D1, the right end portion of first incidence surface 334*a* and the inner end portion of second total reflection surface 335*b* are shifted from each other by 0.50 mm, FIG. 21D is a schematic cross-sectional view illustrating a state where in first direction D1, the right end portion of first incidence surface 334*a* and the inner end portion of second total reflection surface 335*b* are shifted from each other by 0.75 mm, and FIG. 21E is a schematic cross-sectional view illustrating a state where in first direction D1, the right end portion of first incidence surface 334*a* and the inner end portion of second total reflection surface 335*b* are shifted from each other by 1.00 mm. In FIGS. 21A to 21E, the hatching of light flux controlling member 333 is omitted. In FIGS. 22B to 22E, d1 represents a distance between the right end portion of first incidence surface 334*a* and the inner end portion of second total reflection surface 335*b*.

Figure 22:
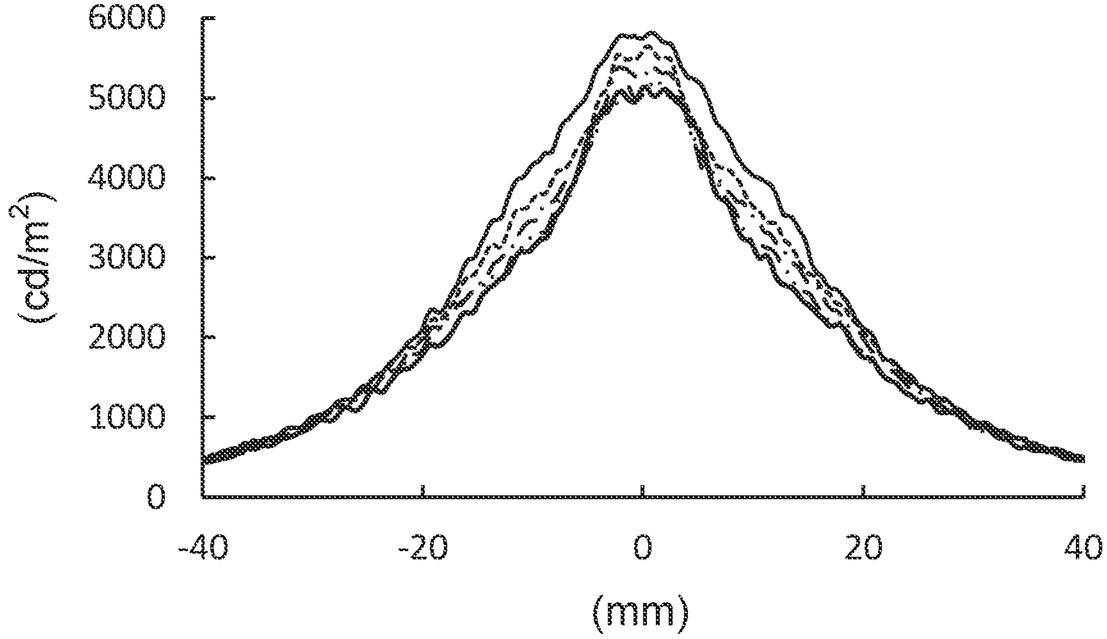
FIG. 22 is a graph illustrating a luminance distribution in the surface light source device.

FIG. 22 illustrates a luminance distribution in surface light source device 300. In FIG. 22, the thin solid line indicates a luminance distribution corresponding to FIG. 21A, the dotted line indicates a luminance distribution corresponding to FIG. 21B, the dashed line indicates a luminance distribution corresponding to FIG. 21C, the chain double-dashed line indicates a luminance distribution corresponding to FIG. 21D, and the thick solid line indicates a luminance distribution corresponding to FIG. 21E. In FIGS. 22A to 22D, the abscissa indicates a distance from central axis CA of light flux controlling member 333, and the ordinate indicates a luminance.

Figure 23A:
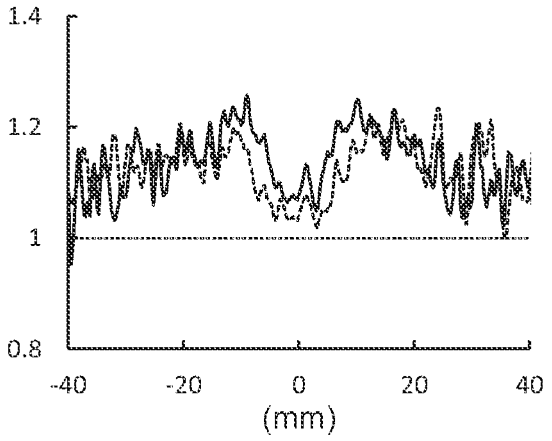
FIGS. 23A to 23D are graphs illustrating a chromaticity distribution in the surface light source device.
Figure 23B:
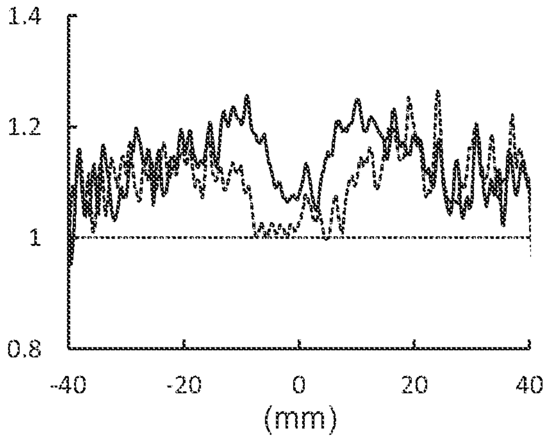
Figure 23C:
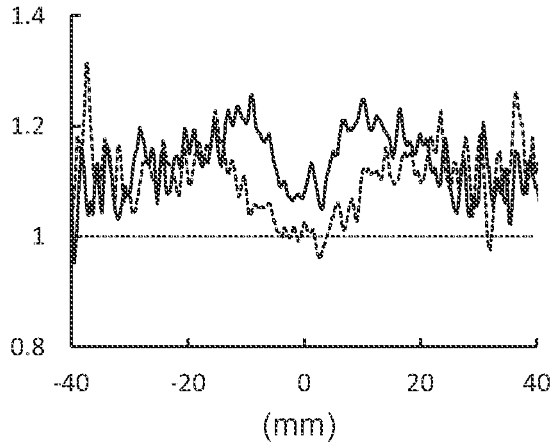
Figure 23D:
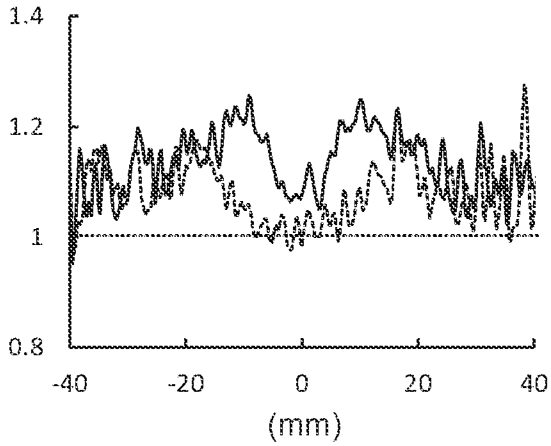

FIGS. 23A to 23D are graphs illustrating a chromaticity distribution in surface light source device 300. FIG. 23A illustrates a chromaticity distribution corresponding to FIGS. 21A and 21B, FIG. 23B illustrates a chromaticity distribution corresponding to FIGS. 21A and 21C, FIG. 23C illustrates a chromaticity distribution corresponding to FIGS. 21A and 21D, and FIG. 23D illustrates a chromaticity distribution corresponding to FIGS. 21A and 21E. In FIGS. 22A to 22D, the abscissa indicates a distance from central axis CA of light flux controlling member 333, and the ordinate indicates change value Δx of x value in a CIE chromaticity diagram. Note that change value Δy of y value in the CIE chromaticity diagram is not illustrated because it did not change much regardless of the positions of the right end portion of first incidence surface 334*a* and the inner end portion of second total reflection surface 335*b* in first direction D1. Note that in FIGS. 23A to 23D, the closer the ordinate value is to 1, the more the color was uniformly mixed.

As illustrated in FIGS. 21A to 21E and 23A to 23D, in first direction D1, the greater the distance of second total reflection surface 335*b* from optical axis OA, the closer the luminance distribution is to the center.

As illustrated in FIGS. 21A to 21E and 23A to 23D, the chromaticity unevenness was improved in the case where the positional displacement between the inner end portion of second total reflection surface 335*b* and the right end portion of first incidence surface 334*a* in first direction D1 was 0.5 mm or greater.

As illustrated in FIGS. 21A to 21E, 22, and 23A to 23D, from the chromaticity distribution and the luminance distribution, it is preferable that the positional displacement of the inner end portion of second total reflection surface 335*b* and the right end portion of first incidence surface 334*a* be within a range of 0.25 to 0.5.

Simulation 2

Next, a positional relationship between the right end portion of first incidence surface 334*a* and optical axis OA of light-emitting element 132 is described below based on the chromaticity distribution and the luminance distribution. The light source device used in the measurement surface includes one light source block 130, and the light source block 130 includes light-emitting element array 132L including two light-emitting elements 132 and one light flux controlling member 333. The size of light-emitting element 132 is 0.4 mm×0.4 mm, and the center-to-center distance of light-emitting element 132 is 12 mm. The arrangement order of the three light emission chips 131*r*, 151*g* and 151*b* in light-emitting element 132 is the same. The distance between substrate 120 and diffusion plate 140 is 10 mm. In addition, the surface of substrate 120 is configured to reflect reaching light toward diffusion plate 140. In addition, surface light source device 100 includes diffusion plate 140, an optical sheet, and a dual brightness enhancement film with a plurality of prisms formed on front and rear sides disposed thereon. In addition, regarding the right end portion of first incidence surface 334*a* and the inner end portion of second total reflection surface 335*b*, the inner end portion of second total reflection surface 335*b* is displaced to the outside by 0.25 mm with respect to the right end portion of first incidence surface 334*a*.

Figure 24A:
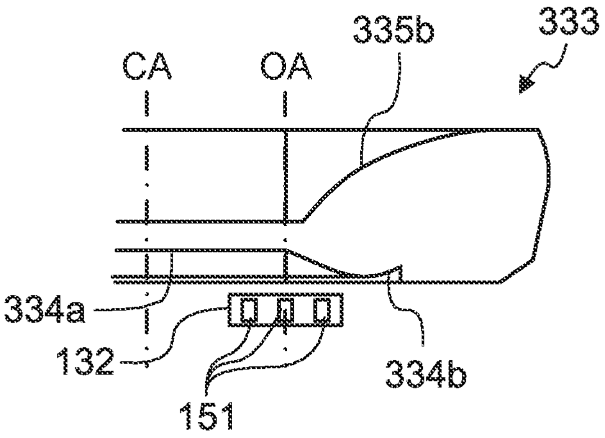
FIGS. 24A to 24C are diagrams for describing the right end portion of the first incidence surface and an optical axis of the light-emitting element.
Figure 24B:
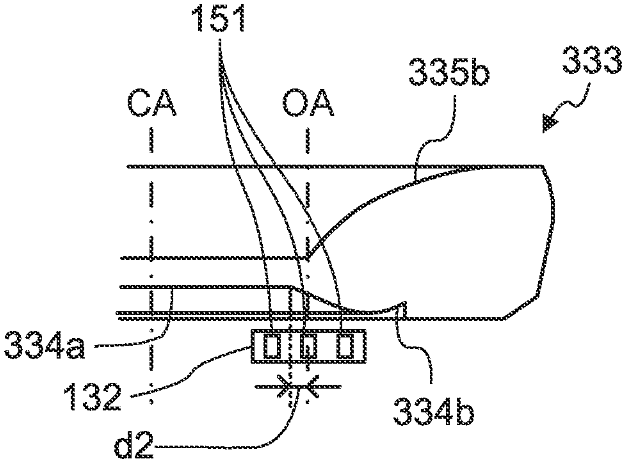
Figure 24C:
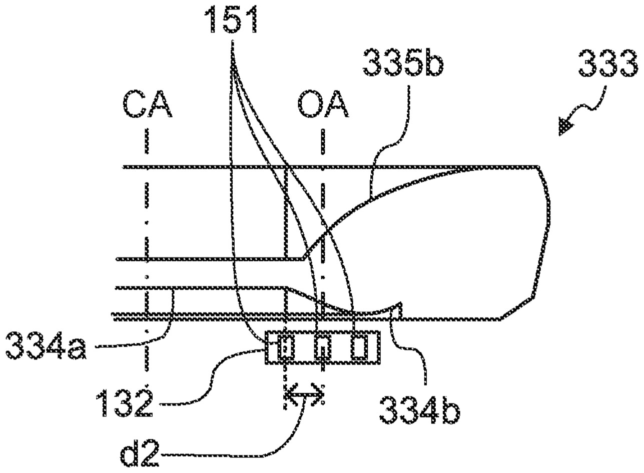

FIGS. 24A to 24C are diagrams for describing the right end portion of first incidence surface 334*a* and optical axis OA of light-emitting element 132. FIG. 24A is a schematic cross-sectional view illustrating a state where the right end portion of first incidence surface 334*a* and optical axis OA of light-emitting element 132 coincide with each other, FIG. 24B is a schematic cross-sectional view illustrating a state where in first direction D1, the right end portion of first incidence surface 334*a* and optical axis OA of light-emitting element 132 are shifted from each other by 0.25 mm, and FIG. 24C is a schematic cross-sectional view illustrating a state where in first direction D1, the right end portion of first incidence surface 334*a* and the optical axis of light-emitting element 132 are shifted from each other by 0.50 mm. In FIGS. 24A to 24C, the hatching of light flux controlling member 333 is omitted. In FIGS. 24B and 24C, d2 indicates a distance between the right end portion of first incidence surface 334*a* and optical axis OA of light-emitting element 132.

Figure 25:
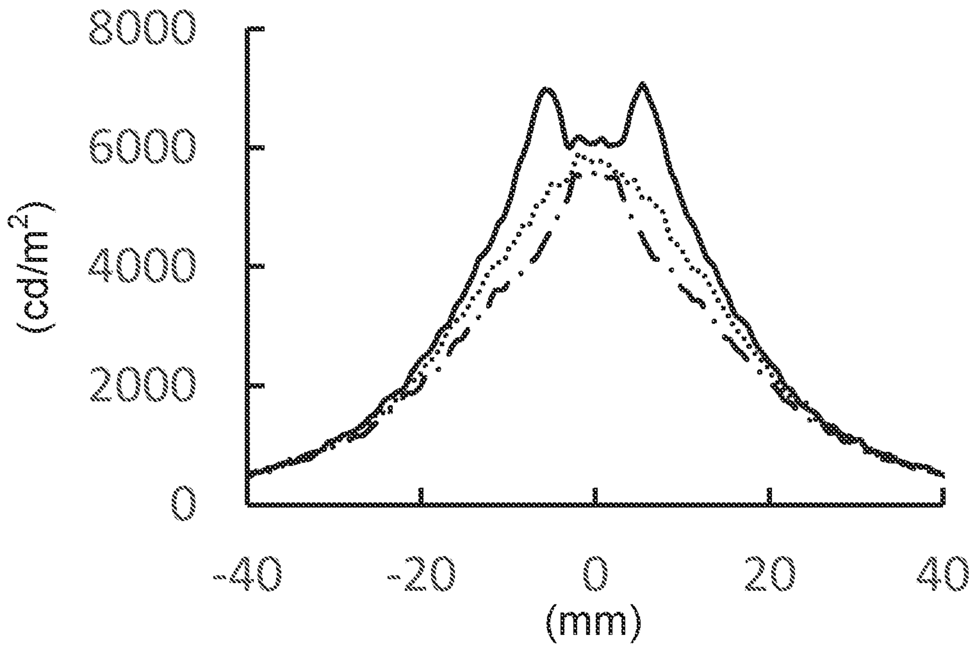
FIG. 25 is a graph illustrating a luminance distribution in the surface light source device.

FIG. 25 is a graph illustrating a luminance distribution in surface light source device 300. In FIG. 25, the solid line indicates a luminance distribution corresponding to FIG. 24A, the dotted line indicates a luminance distribution corresponding to FIG. 24B, and the dashed line indicates a luminance distribution corresponding to FIG. 24C. In FIGS. 25A and 25B, the abscissa indicates a distance from the center of light flux controlling member 333, and the ordinate indicates a luminance.

Figure 26A:
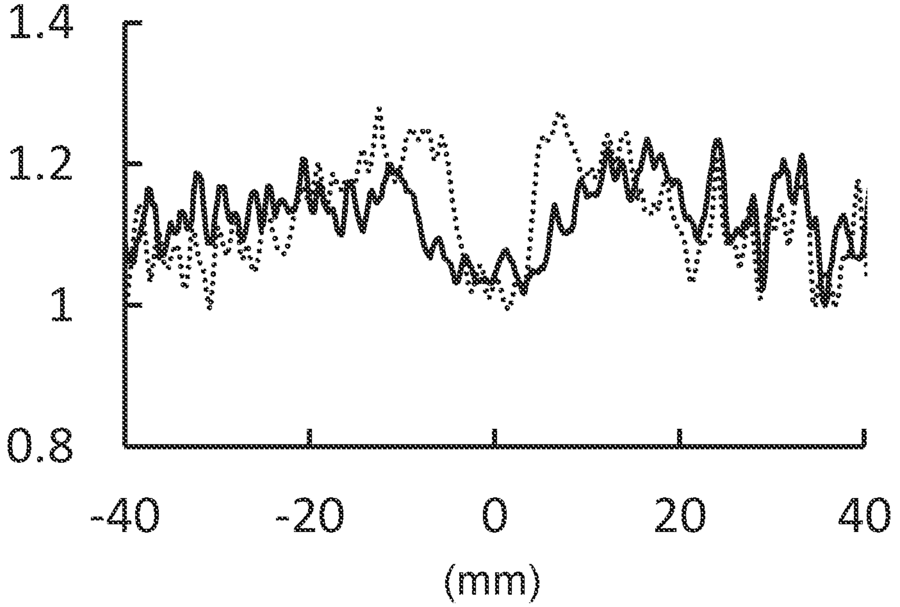
FIGS. 26A and 26B are graphs illustrating a chromaticity distribution in the surface light source device.
Figure 26B:
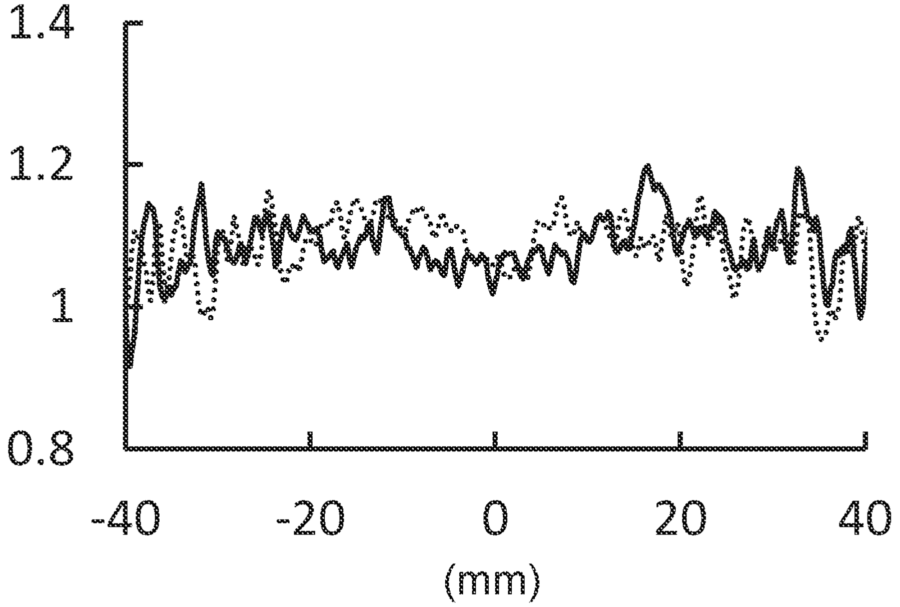

FIGS. 26A and 26B are graphs illustrating a chromaticity distribution in surface light source device 300. FIG. 26A illustrates a chromaticity distribution corresponding to FIGS. 24A and 24B, and FIG. 26B illustrates a chromaticity distribution corresponding to FIGS. 24A and 24C. In FIGS. 26A and 26B, the abscissa indicates a distance from the center of light flux controlling member 333, and the ordinate indicates change value Δx of x value in a CIE chromaticity diagram. Note that in FIGS. 26A and 26B, the closer the ordinate value is to 1, the more the color was uniformly mixed. In FIGS. 26A and 26B, the solid line indicates a result of a case where the optical axis of light-emitting element 132 and the right end portion of first incidence surface 334*a* coincide with each other, and the dotted line indicates a result of a case where the optical axis of light-emitting element 132 and the right end portion of first incidence surface 334*a* are displaced from each other by 0.25 mm. Note that change value Δy of y value in a CIE chromaticity diagram is not illustrated because it did not change much regardless of the positions of the right end portion of first incidence surface 334*a* and optical axis OA of light-emitting element 132.

As illustrated in FIGS. 24A to 24C and 25, in the luminance distribution in surface light source device 300, there was less luminance unevenness when the right end portion of first incidence surface 334*a* and optical axis OA of light-emitting element 132 are displaced from each other by 0.25 mm, than when the right end portion of first incidence surface 334*a* and optical axis OA of light-emitting element 132 coincide with each other.

As illustrated in FIGS. 24A to 24C, 26A and 26B, in the chromaticity distribution of surface light source device 300, there was less chromaticity unevenness when the right end portion of first incidence surface 334*a* and optical axis OA of light-emitting element 132 coincide with each other, than when the right end portion of first incidence surface 334*a* and optical axis OA of light-emitting element 132 displaced from each other by 0.25 mm. In this manner, it was confirmed that the chromaticity unevenness can be reduced when the right end portion of first incidence surface 334*a* and optical axis OA of light-emitting element 132 coincide with each other.

Effects

As described above, in surface light source device 300 according to the present embodiment, light flux controlling member 333 is configured such that light advances in second direction D2 than in first direction D1, and thus surface light source device 300 of the present embodiment can reduce the number of light-emitting elements 132 lit in comparison with surface light source device 100 of Embodiment 1.

INDUSTRIAL APPLICABILITY

The surface light source device according to the present invention can be applied to backlights of liquid crystal display apparatuses, signs, generally-used illumination apparatuses and the like, for example.

REFERENCE SIGNS LIST

100, 300 Surface light source device
110 Housing
120 Substrate
130, 330 Light source block
130A First light source block
130B Second light source block
130C Third light source block
130D Fourth light source block
131, 331 Light-emitting device
131L, 331L Light-emitting device array
132 Light-emitting element
132L Light-emitting element array
132A First light-emitting element
132B Second light-emitting element
133, 333 Light flux controlling member
134, 234, 334 Incidence surface
135, 335 Total reflection surface
136, 236, 336 Emission surface
137, 337 Bottom surface
138, 338 Recess
334*a* First incidence surface
334*b* Second incidence surface
335*a* First total reflection surface
335*b* Second total reflection surface
336*a* First emission surface
336*b* Second emission surface

The invention claimed is:

1. A surface light source device comprising a plurality of light source blocks arranged in a first direction and a second direction orthogonal to the first direction, wherein each of the plurality of light source blocks includes one or more lines of a light-emitting element array including a plurality of light-emitting elements arranged in the first direction;

wherein each of the plurality of light-emitting elements includes a plurality of light emission chips arranged in the first direction, the plurality of light emission chips being different from each other in color of emission light;

wherein in the one or more lines of the light-emitting element array in the light source block, colors of light emitted from all of the light emission chips at both end portions are the same; and wherein in plan view, each pair of adjacent ones of the light-emitting elements in the light emitting element array is disposed such that colors of light emitted from the light emission chips are line-symmetric with respect to a boundary between the adjacent light-emitting elements.

2. The surface light source device according to claim 1, wherein the plurality of light-emitting elements includes a red emission chip configured to emit red light, a green light emission chip configured to emit green light, and a blue emission chip configured to emit blue light.

3. The surface light source device according to claim 1, wherein in each of the plurality of light source blocks, a plurality of lines of the light-emitting element array is disposed in the second direction.

4. The surface light source device according to claim 1, wherein in the plurality of light-emitting elements, a first light-emitting element and a second light-emitting element adjacent to each other are disposed such that a color of light emitted from a light emission chip at a position closest to the second light-emitting element in the first light-emitting element and a color of light emitted from a light emission chip at a position closest to the first light-emitting element in the second light-emitting element are the same.

5. The surface light source device according to claim 3, wherein the plurality of light-emitting elements is disposed in a rectangular grid.

6. The surface light source device according to claim 1, further comprising a plurality of light flux controlling members configured to control light emitted from the plurality of light-emitting elements.

7. The surface light source device according to claim 6, wherein each of the plurality of light flux controlling members includes a scattering member.

8. The surface light source device according to claim 6, wherein each of the plurality of light source blocks includes one line of the light-emitting element array, wherein each of the plurality of light source blocks further includes one light flux controlling member configured to control light emitted from the one line of the light-emitting element array, and wherein the light flux controlling member is configured such that light advances farther in the second direction than in the first direction.

9. The surface light source device according to claim 8, wherein the light flux controlling member includes:

an incidence surface that is an inner surface of a recess opening at a bottom surface, the incidence surface being disposed to intersect optical axes of an even number of the light-emitting elements;

a total reflection surface configured to reflect at least in the second direction light entered from the incidence surface; and an emission surface configured to emit to outside light reflected by the total reflection surface, and wherein the total reflection surface includes:

two first total reflection surfaces extending along the first direction and each including two end portions in the first direction; and two second total reflection surfaces each configured to connect both ends of the two first total reflection surfaces in the first direction.

10. The surface light source device according to claim 9, wherein each of the two second total reflection surfaces is disposed such that the greater a distance from the optical axis in the first direction, the farther each of the two second total reflection surfaces is from the light-emitting element in a direction along the optical axis, each of the two second total reflection surfaces including an inner end portion disposed on an optical axis side and an outer end portion disposed at a position farther from the optical axis than the inner end portion in the first direction, wherein the incidence surface includes:

a first incidence surface disposed opposite to a light-emitting surface of the light-emitting element; and a second incidence surface configured to connect the first incidence surface and the bottom surface, and wherein in the first direction, an end portion of the first incidence surface is disposed on inside than the inner end portion of the second total reflection surface.

11. The surface light source device according to claim 10, wherein in the first direction, the optical axis of the light-emitting element at both ends included in the light-emitting element array in the light source block coincides with the end portion of the first incidence surface.

12. The surface light source device according to claim 1, wherein a center-to-center distance of the plurality of light-emitting elements is within a range of 2 to 80 mm.

13. The surface light source device according to claim 1, wherein an order of the plurality of light emission chips is the same in a first light source block and a second light source block adjacent to each other in the first direction among the plurality of light source blocks.

14. The surface light source device according to claim 1, wherein an order of the plurality of light emission chips is the same in a third light source block and a fourth light source block adjacent to each other in the second direction among the plurality of light source blocks.

15. The surface light source device according to claim 1, further comprising a diffusion plate configured to diffuse light emitted from the plurality of light-emitting elements while transmitting the light emitted from the plurality of light-emitting elements.

16. The surface light source device according to claim 15, further comprising a substrate on which the plurality of light-emitting elements is disposed, wherein a distance between the substrate and the diffusion plate is within a range of 1 to 30 mm.

17. The surface light source device according to claim 16, wherein a ratio of the distance between the substrate and the diffusion plate with respect to a center-to-center distance of the plurality of light-emitting elements is 0.15 or greater.

* * * * *